(12) United States Patent
Lee et al.

(10) Patent No.: US 12,381,160 B2
(45) Date of Patent: Aug. 5, 2025

(54) MEMORY DEVICE PACKAGE WITH NOISE SHIELDING

(71) Applicant: Intel Corporation, Santa Clara, CA (US)

(72) Inventors: Jaejin Lee, Beaverton, OR (US); Christopher E. Cox, Placerville, CA (US); Jun Liao, Portland, OR (US); Xiang Li, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 991 days.

(21) Appl. No.: 16/824,544

(22) Filed: Mar. 19, 2020

(65) Prior Publication Data

US 2020/0219825 A1 Jul. 9, 2020

(51) Int. Cl.
*H01L 23/552* (2006.01)
*H01L 23/00* (2006.01)
*H01L 23/31* (2006.01)
*H01L 23/498* (2006.01)

(52) U.S. Cl.
CPC ........ *H01L 23/552* (2013.01); *H01L 23/3128* (2013.01); *H01L 23/49816* (2013.01); *H01L 23/49827* (2013.01); *H01L 24/48* (2013.01); *H01L 2224/48225* (2013.01); *H01L 2924/1434* (2013.01); *H01L 2924/3025* (2013.01)

(58) Field of Classification Search
CPC .............. H01L 23/552; H01L 23/3128; H01L 23/49816; H01L 23/49827; H01L 24/48; H01L 2224/48225; H01L 2924/1434; H01L 2924/3025; H01L 2221/68345; H01L 2224/16227; H01L 2224/48091; H01L 2224/48227; H01L 2224/48235; H01L 2224/8592; H01L 2924/00014; H01L 2924/15311; H01L 2924/181; H01L 23/3135; H01L 25/105; H01L 23/49838
USPC ....................................................... 257/659
See application file for complete search history.

(56) References Cited

U.S. PATENT DOCUMENTS

| 9,953,933 B1 | 4/2018 | Cadag et al. |
| 10,429,974 B2 | 10/2019 | Chen et al. |
| 2001/0008301 A1 | 7/2001 | Terui |

(Continued)

FOREIGN PATENT DOCUMENTS

KR 20090039407 A * 4/2009

OTHER PUBLICATIONS

KR-20090039407-A, Apr. 22, 2009.*

(Continued)

*Primary Examiner* — Eva Y Montalvo
*Assistant Examiner* — Pratiksha Jayant Lohakare
(74) *Attorney, Agent, or Firm* — Compass IP Law PC

(57) ABSTRACT

A memory device includes a grounded molding. The memory device includes a substrate having a first surface for a memory die, where the substrate has ground vias through substrate to connect to a ground reference. The substrate has a ball grid array (BGA) on the opposite surface, including perimeter balls to connect to ground connections. The grounded molding includes an electrically conductive epoxy mold to cover the memory die, where the electrical conductivity of the molding, with the molding grounded can provide radio frequency interference (RFI) shielding.

15 Claims, 9 Drawing Sheets

(56) References Cited

U.S. PATENT DOCUMENTS

| | | | | |
|---|---|---|---|---|
| 2008/0061406 A1* | 3/2008 | Joh | ............... | H01L 23/552 |
| | | | | 257/E23.114 |
| 2010/0276792 A1* | 11/2010 | Chi | ............... | H01L 23/3128 |
| | | | | 257/E23.116 |
| 2012/0015687 A1 | 1/2012 | Yamada et al. | | |
| 2012/0292772 A1 | 11/2012 | Yorita et al. | | |
| 2014/0064529 A1 | 3/2014 | Jang | | |
| 2017/0027066 A1* | 1/2017 | Hassel | ............... | C23C 16/14 |
| 2018/0007791 A1* | 1/2018 | Prakash | ............... | H01L 23/498 |
| 2018/0122748 A1* | 5/2018 | Hsu | ............... | H01L 23/552 |
| 2019/0045622 A1* | 2/2019 | Liao | ............... | H05K 1/145 |
| 2019/0103366 A1* | 4/2019 | Lee | ............... | H01L 23/3114 |
| 2019/0311963 A1* | 10/2019 | Christianson | ............... | H01P 3/081 |

OTHER PUBLICATIONS

Partial European Search Report for Patent Application No. 20215675.8, Mailed May 26, 2021, 13 pages.

Extended European Search Report for Patent Application No. 20215675.8, Mailed Aug. 27, 2021, 12 pages.

\* cited by examiner

MEMORY DEVICE PACKAGE WITH NOISE SHIELDING

FIELD

Descriptions are generally related to memory devices, and more particular descriptions are related to memory device packaging to provide noise shielding.

BACKGROUND

As memory technologies continue to advance, the data rates continue to increase. Memory subsystems currently in development will support data rates higher than 6400 MT/s (mega-transfers per second). With increasing memory frequency or data rates, the memory devices generate unintentional radio frequency interference (RFI) with high speed Wi-Fi bands in 5 GHz and 6 GHz frequencies.

Emerging computer systems include system-on-chip (SOC) with a processor device and on-package memory. Such an SOC with on-package memory increases the risk of memory noise radiation from the SOC, which causes unavoidable degradation of wireless communications in client mobile systems. Current systems require on-board shielding to minimize the radio frequency noise radiation. On-board shielding essentially attempts to create a Faraday cage enclosure around the on-package memory. On-board shielding is a physical shield enclosure, which increases cost, material, and physical height.

On-board shields increase the cost of the bill of manufacturing. Additionally, traditional on-board shielding increases the system height (the height in the z-dimension) and may degrade system thermal management due to airflow reduction. Furthermore, poor mechanical and electrical shield designs reduce shielding effectiveness.

BRIEF DESCRIPTION OF THE DRAWINGS

The following description includes discussion of figures having illustrations given by way of example of an implementation. The drawings should be understood by way of example, and not by way of limitation. As used herein, references to one or more examples are to be understood as describing a particular feature, structure, or characteristic included in at least one implementation of the invention. Phrases such as "in one example" or "in an alternative example" appearing herein provide examples of implementations of the invention, and do not necessarily all refer to the same implementation. However, they are also not necessarily mutually exclusive.

Figure 1A:
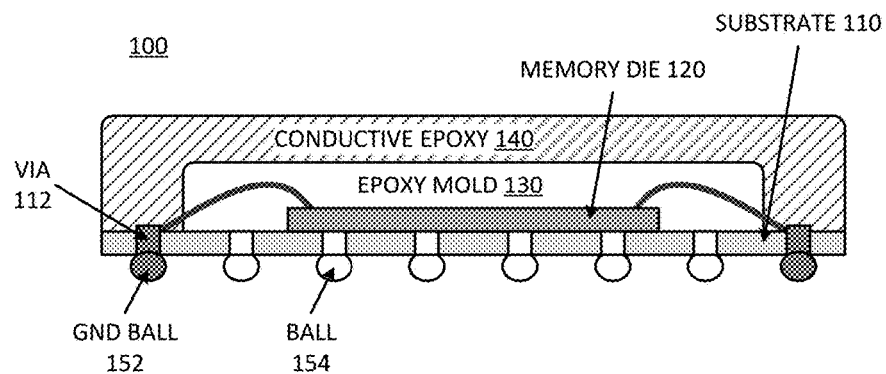
FIG. 1A is a circuit diagram of a cut away view of an example of a memory device with a grounded conductive device molding.
Figure 1B:
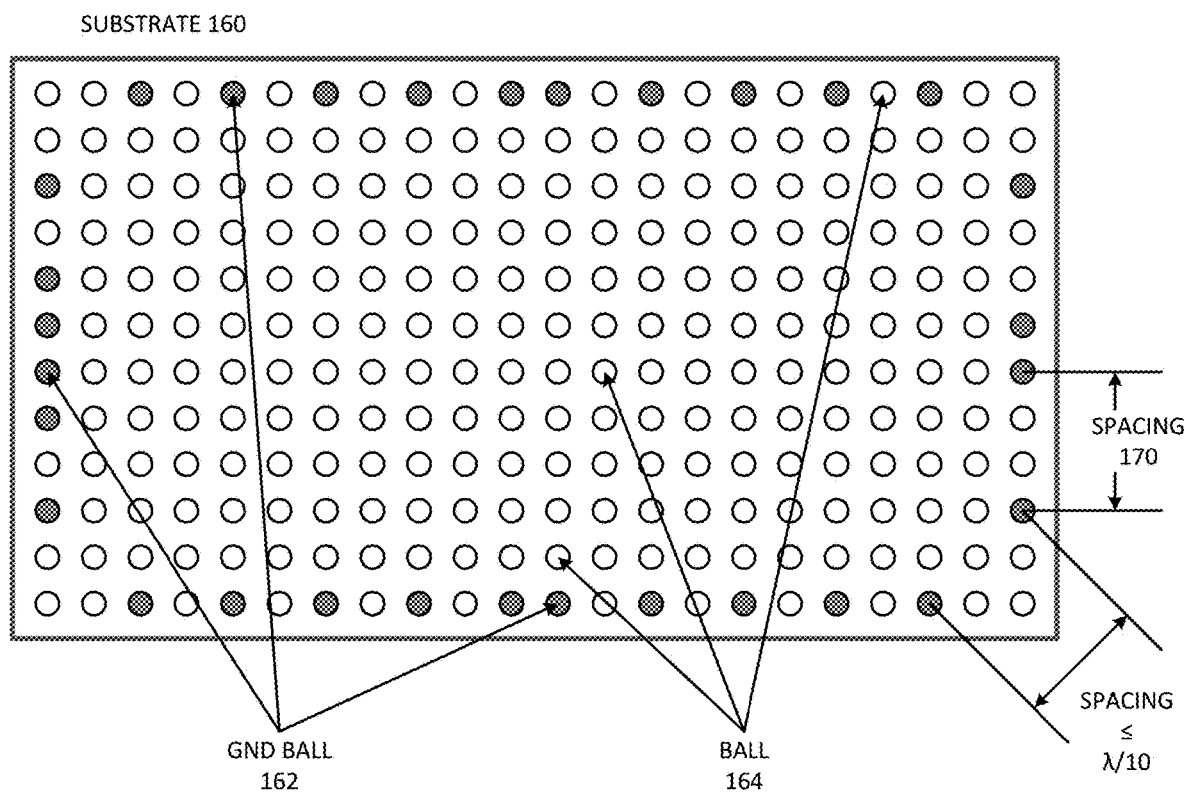
FIG. 1B is an example of a ball grid array (BGA) layout for a grounded memory device molding with the molding connected to existing ground connections.

Descriptions of certain details and implementations follow, including non-limiting descriptions of the figures, which may depict some or all examples, and well as other potential implementations.

DETAILED DESCRIPTION

As described herein, a memory device has self-shielded packaging. The self-shielded packaging includes a grounded molding that reduces radio frequency interference (RFI). The memory device includes a substrate having a first surface for a memory die, where the substrate has ground vias through substrate to connect to a ground reference. The substrate has a ball grid array (BGA) on the opposite surface, including perimeter balls to connect to ground connections. The grounded molding includes an electrically conductive epoxy mold to cover the memory die, where the electrical conductivity of the molding, with the molding grounded can provide radio frequency interference (RFI) shielding.

The grounded molding can function similar to a Faraday cage enclosure, but without increases bill of materials and without changing the memory device profile. The packaging of the memory device itself can operate as a low-profile electrical shielding structure to suppress memory noise. Thus, self-shielded memory devices can eliminate bulky on-board shield while maintaining reliable wireless connectivity in the system.

With memory noise shielding, a self-shielded package can reduce the noise interference sufficiently to enable on-package memory integration without needing additional shielding. In general, the on-package memory can be integrated onto a computing integrated circuit (I/C). In one example, the on-package memory can be integrated onto a system-on-chip (SOC) device, which can include a type of processor (such as a primary processor or a graphics processor) and the memory. In one example, the on-package memory can be integrated onto a central processing unit (CPU) can include a central processor core, the memory, and one or more peripheral chips.

In one example, the memory device includes packaging that includes molding formed of conductive epoxy. The conductive epoxy can be, for example, a mixture of epoxy and conductive particles. With a memory device substrate and a ball grid array (BGA), the memory device can be self-shielded when the conductive epoxy molding is electrically connected to ground vias through the memory device substrate to connect to BGA balls on the mounting surface of the memory device. In one example, the ground balls in the BGA array refer to ground balls on the perimeter of the BGA array. The perimeter balls refer to balls on the edge of the package or an edge of the BGA array. The perimeter ground balls connected to the conductive molding can have a spacing that reduces interference for one or more frequencies of interest.

A self-shielded memory device can be used as an on-package memory device, with sufficient shielding to ensure high speed memory communication as well as the use of Wi-Fi connectivity in the system. In one example, the grounding of the conductive packaging can be accomplished with already-existing BGA ball ground connections for a memory device package. For example, certain ground connections for BGA balls on DRAM (dynamic random access memory) devices can provide mechanical stability, and be reused for shielding.

In one example, the use of the self-shielding memory device packaging can provide shielding without increasing the memory device footprint and without increasing the cost of manufacture or adding of additional shielding components. With a self-shielded memory device, a system can adopt high speed memory devices on an SOC package, which would not otherwise be available due to noise constraints. The use of higher speed memory allows for faster computing performance. The size of the SOC package can be the same as with traditional memory, with no need for additional space to provide separate shielding.

FIG. 1A is a circuit diagram of a cut away view of an example of a memory device with a grounded conductive device molding. Memory device 100 illustrates an example of a memory device with self-shielding. Memory device 100 includes substrate 110, which represents a structural and electrical connection element for memory device 100. Substrate 110 provides a physical structure on which to mount memory die 120. Substrate 110 also provides electrical connection of memory die 120 to other elements.

Memory die 120 represents a memory chip or a bare memory die. For example, the bare memory die can be a die cut from a wafer of devices. Typically, the bare die includes one or more connection points to connect electrical points on memory die 120 to the external connectors of memory device 100. In one example, memory die 120 includes connection points on top of the die to which are connected to corresponding connection points on substrate 110.

Substrate 110 includes vias from the side on which memory die 120 is mounted to the side (typically referred to as the "bottom side") of the memory device 100, which allows it to mount to another substrate or board. Vias through substrate 110, such as via 112, provide connection for traces or wire bonds to connect to balls of a ball grid array (BGA). A wire bond refers to a wire that connects from a connection point on memory die 120 to a connection point on substrate 110. Via 112 specifically provides a connection of conductive epoxy 140 to ground ball 152.

Substrate 110 can be considered to have a first surface and a second surface. While the orientation is arbitrary, the first surface can refer to the top surface on which memory die 120 is mounted. The second surface can refer to the opposite surface, which is the surface connected to the BGA balls, and which is the mounting surface of memory device 100, with electrical and signal connections. The vias pass through from the one surface to the other surface. From a different perspective, the second surface could be considered the surface to which memory die 120 is mounted, and the first surface could be considered the surface having the BGA balls.

For the cutaway view of device 100, the thin lines from memory die 120 to the darker vias 112 represent wirebonds to ground connections. Ground (GND) ball 152 represents a ground ball, which is a ball to connect to a corresponding ground connection of a board or substrate to which device 100 will connect. Ground ball 152 more specifically represents a perimeter ground ball, and there may be ground connections of the BGA array that are not on the perimeter. Ball 154 represents any ball for a connection other than a perimeter ground connection.

Memory device 100 includes packaging in the form of molding on top of substrate 110. The molding or packaging includes conductive epoxy 140, which represents a molding that has electrical conductivity. Conductive epoxy 140 is electrically connected to system ground through ground ball 152, through via 112. Via 112 represents a via or opening through substrate 110. In one example, one or more ground connections of memory die 120 connect to ground ball 152 through a wire bond (not specifically labeled) electrically connected to via 112.

The molding can be epoxy resin that is deposited on the device, and allowed to cure (e.g., through chemical processes, thermal processes, or a combination of chemical and thermal processes). The epoxy resin cures or sets into the molding that provides the packaging of the memory device.

It will be understood that having a conductive epoxy in direct contact with memory die 120 may be undesirable due to a shorting electrical connection. In one example, memory device 100 includes epoxy mold 130 in direct contact with memory die 120, which can cover the die and wirebonds that are not connected to ground. In one example, wirebonds that are connected to ground can extend into physical contact with conductive epoxy 140.

In one example, memory die 120 can be flip-chip mounted to substrate 110, which can provide electrical connection to traces and via on the die-mounting surface of substrate 110. Such a flip-chip connection may expose fewer or no open electrical paths, which could enable the use of conductive epoxy for the entire molding in one implementation. For example, traces could be covered with electrically non-conductive coating prior to application of the conductive epoxy 140.

It will be understood that the diagram of memory device 100 is representative of the perimeter ground ball and other balls of the BGA, but is not necessarily to scale. For example, there may be more than eight columns or rows of BGA balls. It will also be understood that while the perimeter balls are shaded and the non-perimeter balls are not shaded, there can be ground connections in the non-perimeter balls. The perimeter ground balls provide the noise shielding, while the non-perimeter ground balls do not necessarily provide noise shielding.

In one example, memory device 100 is a DRAM (dynamic random access memory) device package. A self-shielded DRAM package can enable and facilitate on-package memory integration for client mobile PC (personal computer) systems. In one example, conductive epoxy 140 is a layer of conductive epoxy over an existing mold represented by epoxy mold 130, which can be traditional packaging or molding for the DRAM device. In one example, via 112 is specifically a ground via, and thus, conductive epoxy 140 can be electrically connected to ground BGA ball 152 through GND via 112.

In one example, via 112 is pre-filled with metal or conductor that the epoxy connects to on the top of substrate 110. In one example, via 112 is open, and conductive epoxy 140 flows into the via to make electrical contact with ground ball 152. In one example where the epoxy flows into via 112, the via can be lined with conductor.

FIG. 18 is an example of a ball grid array (BGA) layout for a grounded memory device molding with the molding connected to existing ground connections. Substrate 160 is an example of a memory device substrate in accordance with substrate 110 of FIG. 1A. More specifically, substrate 160 is seen looking directly at the surface having the BGA balls.

As illustrated, substrate 160 includes a 12×22 ball array, which is merely illustrative. Other array or grid layouts and sizes are possible. As illustrated, the outer edge of the ball grid array includes ground balls 162. Only three ground balls are specifically pointed out, but it will be observed that they are all on the outer edge and are shaded for identification.

The array of substrate 160 also includes multiple balls 164 that are not shaded, which are the balls other than the perimeter ground balls to which the conductive packaging connects. Three random non-ground balls are specifically pointed to. In general, the balls that do not ground-connect the conductive packaging include all interior balls (non-perimeter) and perimeter balls that are not connected to the conductive packaging. In one example, the conductive packaging is connected to all perimeter balls that connect to ground. In one example, the conductive packaging is connected to selected perimeter balls that are connected to ground. In one example, the conductive packaging is electrically connected to perimeter ground balls that are already part of the memory device or DRAM packaging. Thus, ground balls that already exist can be reused for the conductive packaging to provide noise shielding.

In one example, the perimeter ground balls have a maximum spacing. In one example, the spacing is constrained to be less than $\lambda radio/10$, where $\lambda radio$ refers to a highest wavelength of radio operating frequency of noise to be suppressed. Such a notation could be more precisely stated as having a maximum distance defined by the radio frequency of interest ($\lambda$ or lambda) divided by 10, or $1/(\lambda radio/10)$, which provides a value in meters. The frequency of interest represents a center frequency of noise to suppress. For example, for a frequency of 6 GHz ($6\times10^9$ Hz), the spacing could be constrained to $d=(c/((6\times10^9/10))=(3/6)*(10^{(8-10)})=5$ mm, where d is the spacing distance and c is the speed of light constant, approximated as $3\times10^8$ for purposes here.

It will be understood that other frequencies of interest could be targeted for shielding; the example of 6 GHz is a frequency that causes noise in Wi-Fi operation. When made to suppress 6 GHz noise, the shielding can be effective against memory noise emission in the high-speed Wi-Fi bands in 5 GHz and 6 GHz frequencies. As illustrated, spacing 170 can represent a maximum spacing. The grounded perimeter balls can be closer together, but may not be effective at shielding noise if they are spaced further apart.

Figure 2A:
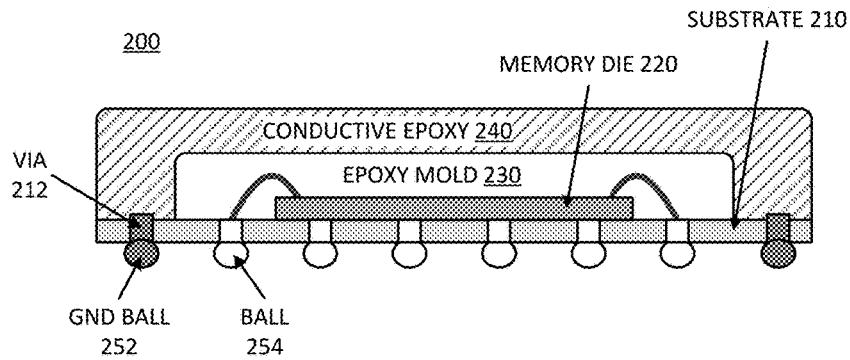
FIG. 2A is a circuit diagram of a cut away view of an example of a memory device with a grounded conductive device molding.

FIG. 2A is a circuit diagram of a cut away view of an example of a memory device with a grounded conductive device molding. Memory device 200 provides an example of a memory device similar to memory device 100 of FIG. 1A, but with dedicated perimeter ground balls to ground the self-shielded packaging.

Memory device 200 includes substrate 210, which represents a structural and electrical connection element for memory device 200. Substrate 210 provides a physical structure on which to mount memory die 220. Substrate 210 also provides electrical connection of memory die 220 to other elements.

Memory die 220 represents a memory chip or a bare memory die. For example, the bare memory die can be a die cut from a wafer of devices. Typically, the bare die includes one or more connection points to connect electrical points on memory die 220 to the external connectors of memory device 200. In one example, memory die 220 includes connection points on top of the die to which are connected to corresponding connection points on substrate 210.

Substrate 210 includes vias from the side on which memory die 220 is mounted to the side (typically referred to as the "bottom side") of the memory device 200, which allows it to mount to another substrate or board. Vias through substrate 210, such as via 212 provide connection for traces or wire bonds to connect to balls of a ball grid array (BGA). A wire bond refers to a wire that connects from a connection point on memory die 220 to a connection point on substrate 210. Via 212 specifically provides a connection of conductive epoxy 240 to ground ball 252.

Substrate 210 can be considered to have a first surface and a second surface. While the orientation is arbitrary, the first surface can refer to the top surface on which memory die 220 is mounted. The second surface can refer to the opposite surface, which is the surface connected to the BGA balls, and which is the mounting surface of memory device 200, with electrical and signal connections. The vias pass through from the one surface to the other surface. From a different perspective, the second surface could be considered the surface to which memory die 220 is mounted, and the first surface could be considered the surface having the BGA balls.

For the cutaway view of device 200, the thin lines from memory die 220 to the lighter vias represent wirebonds. Ground (GND) ball 252 represents a ground ball, which is a ball to connect to a corresponding ground connection of a board or substrate to which device 200 will connect. Ground ball 252 more specifically represents a perimeter ground ball, and there may be ground connections of the BGA array that are not on the perimeter. Ball 254 represents any ball for a connection other than a perimeter ground connection. In one example, ground ball 252 represents dedicated perimeter ground balls, which provide a grounding perimeter around the packaging of memory device 200.

Memory device 200 includes packaging in the form of molding on top of substrate 210. The molding or packaging includes conductive epoxy 240, which represents a molding that has electrical conductivity. Conductive epoxy 240 is an epoxy mold electrically connected to system ground through ground ball 252, through via 212. Via 212 represents a via or opening through substrate 210. In one example, connection points of memory die 220 do not connect to ground ball 252 through wirebond connection.

The molding can be epoxy resin that is deposited on the device, and allowed to cure (e.g., through chemical processes, thermal processes, or a combination of chemical and thermal processes). The epoxy resin cures or sets into the molding that provides the packaging of the memory device.

It will be understood that having a conductive epoxy in direct contact with memory die 220 may be undesirable due to a shorting electrical connection. In one example, memory device 200 includes epoxy mold 230 in direct contact with memory die 220, which can cover the die and wirebonds that are not connected to ground. In one example, wirebonds that are connected to ground can extend into physical contact with conductive epoxy 240.

In one example, memory die 220 can be flip-chip mounted to substrate 210, which can provide electrical connection to traces and via on the die-mounting surface of substrate 210. Such a flip-chip connection may expose fewer or no open electrical paths, which could enable the use of conductive epoxy for the entire molding in one implementation. For example, traces could be covered with electrically non-conductive coating prior to application of the conductive epoxy 240.

It will be understood that the diagram of memory device 200 is representative of the perimeter ground ball and other balls of the BGA, but is not necessarily to scale. For example, there may be more than eight columns or rows of BGA balls.

In one example, memory device 200 is a DRAM (dynamic random access memory) device package. A self-shielded DRAM package can enable and facilitate on-package memory integration for client mobile PC systems. In one example, conductive epoxy 240 is a layer of conductive epoxy over an existing mold represented by epoxy mold 230, which can be traditional packaging or molding for the DRAM device. In one example, via 212 is specifically a ground via, and thus, conductive epoxy 240 can be electrically connected to ground BGA ball 252 through GND via 212.

In one example, via 212 is pre-filled with metal or conductor that the epoxy connects to on the top of substrate 210. In one example, via 212 is open, and conductive epoxy 240 flows into the via to make electrical contact with ground ball 252. In one example where the epoxy flows into via 212, the via can be lined with conductor.

Figure 2B:
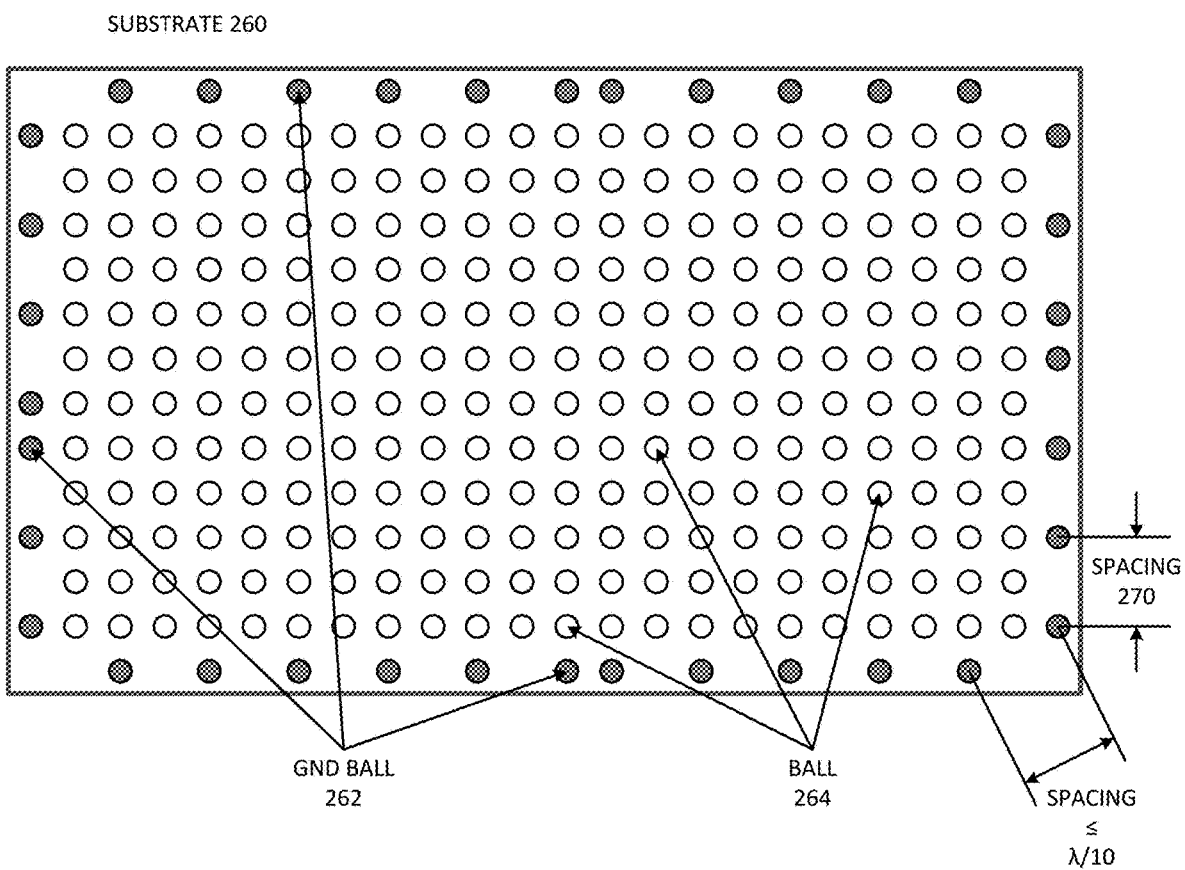
FIG. 2B is an example of a ball grid array (BGA) layout for a grounded memory device molding with the molding connected to ground connections dedicated to grounding the molding.

FIG. 2B is an example of a ball grid array (BGA) layout for a grounded memory device molding with the molding connected to ground connections dedicated to grounding the molding. Substrate 260 is an example of a memory device substrate in accordance with substrate 210 of FIG. 2A. More specifically, substrate 260 is seen looking directly at the surface having the BGA balls.

As illustrated, substrate 260 includes a 12×22 ball array, which is merely illustrative. In addition to the 12×22 ball array, substrate 260 includes dedicated perimeter balls in addition to the signal balls. The signal balls correspond to connection points on memory die 220, and connect to provide voltage reference signal (e.g., ground and high voltage) and communication signals, such as command signal lines and data signal lines. Other array or grid layouts and sizes are possible. As illustrated, the outer edge of the ball grid array includes ground balls 262. Only three ground balls are specifically pointed out, but it will be observed that the outer edge of balls is ground balls. In one example, substrate 260 only includes the balls needed for shielding, and thus, may not have a perimeter ground ball for every row or column of the signal balls. In one example, substrate 260 includes signal balls, structural balls (e.g., ground balls on the outside of the BGA, included within the 12×22 array), as well as the dedicated grounding balls. When dedicated ground balls are included outside the signal array, additional structural ground balls may be unnecessary, and the array layout/structure could be modified.

The array of substrate 260 also includes multiple balls 264 that are not shaded, which are the balls other than the perimeter ground balls to which the conductive packaging connects. Three random non-ground balls are specifically pointed to. In one example, the conductive packaging is connected to all perimeter balls that connect to ground.

In one example, the perimeter ground balls have a maximum spacing. In one example, the spacing is constrained to be less than $\lambda radio/10$, where $\lambda radio$ refers to a highest wavelength of radio operating frequency of noise to be suppressed. Such a notation could be more precisely stated as having a maximum distance defined by the radio frequency of interest divided by 10, or $1/(\lambda radio/10)$, which provides a value in meters. For example, for a frequency of 6 GHz ($6 \times 10^9$ Hz), the spacing could be constrained to $d=(c/((6 \times 10^9/10))=(3/6)*(10^(8-10))=5$ mm, where d is the spacing distance and c is the speed of light constant, approximated as $3 \times 10^8$ for purposes here.

It will be understood that other frequencies of interest could be targeted for shielding; the example of 6 GHz is a frequency that causes noise in Wi-Fi operation. When made to suppress 6 GHz noise, the shielding can be effective against memory noise emission in the high-speed Wi-Fi bands in 5 GHz and 6 GHz frequencies. As illustrated, spacing 270 can represent a maximum spacing. The grounded perimeter balls can be closer together, but may not be effective at shielding noise if they are spaced further apart.

Figure 3A:
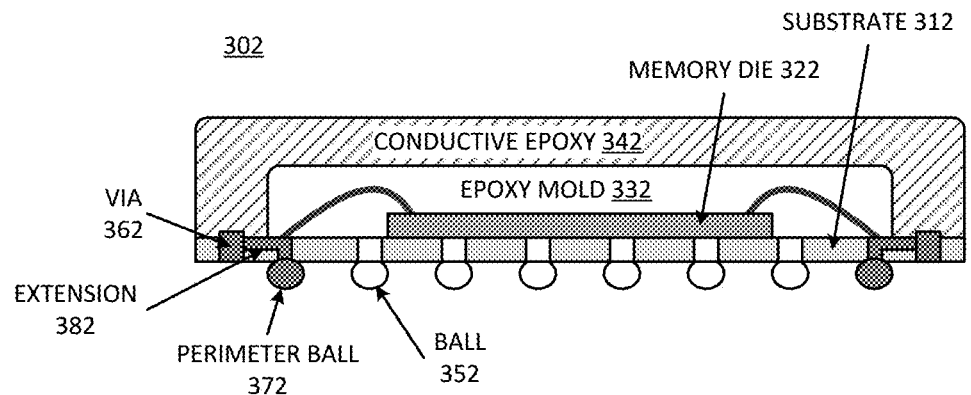
FIG. 3A is a circuit diagram of a cut away view of an example of a memory device with a conductive device molding grounded through a trace extension from a via to a perimeter ball.

FIG. 3A is a circuit diagram of a cut away view of an example of a memory device with a conductive device molding grounded through a trace extension from a via to a perimeter ball. Memory device 302 provides an example of a memory device similar to memory device 100 of FIG. 1A. Memory device 302 includes substrate 312, which represents a structural and electrical connection element for memory device 302. Substrate 312 provides a physical structure on which to mount memory die 322. Substrate 312 also provides electrical connection of memory die 322 to other elements.

Memory die 322 represents a memory chip or a bare memory die. For example, the bare memory die can be a die cut from a wafer of devices. Typically, the bare die includes one or more connection points to connect electrical points on memory die 322 to the external connectors of memory device 302. In one example, memory die 322 includes connection points on top of the die to which are connected to corresponding connection points on substrate 312. In an alternative example, memory die 322 is flip-chip mounted to substrate 312.

Substrate 312 includes vias from the side on which memory die 322 is mounted to the side (typically referred to as the "bottom side") of the memory device 302, which allows it to mount to another substrate or board. Vias through substrate 312 provide connection for traces or wire bonds to connect to balls of a ball grid array (BGA). A wire bond refers to a wire that connects from a connection point on memory die 322 to a connection point on substrate 312. Via 362 specifically provides a connection of conductive epoxy 342 to perimeter ball 372, which is to connect to a ground connection.

Substrate 312 can be considered to have a first surface and a second surface. While the orientation is arbitrary, the first surface can refer to the top surface on which memory die 322 is mounted. The second surface can refer to the opposite surface, which is the surface connected to the BGA balls, and which is the mounting surface of memory device 302, with electrical and signal connections. The vias pass through from the one surface to the other surface. From a different perspective, the second surface could be considered the surface to which memory die 322 is mounted, and the first surface could be considered the surface having the BGA balls.

For the cutaway view of device 302, the thin lines from memory die 322 to the darker vias 362 represent wirebonds. Perimeter ball 372 represents a ground ball, which is a ball to connect to a corresponding ground connection of a board or substrate to which device 302 will connect. Ball 352 represents any ball for a connection other than a perimeter ground connection to ground conductive epoxy 342.

As illustrated, perimeter ball 372 is not vertically aligned with via 362. In one example, conductive epoxy 342 extends beyond the footprint of the BGA of device 302. In one example, device 302 includes extension 382 to electrically couple via 362 to perimeter ball 372. Extension 382 can represent any metal, conductor, trace, wire, or other electrical connection to provide the electrical connection of conductive epoxy 342 to perimeter ball 372. Extension 382 extends horizontally to connect a via that is not vertically aligned to a corresponding ground ball.

Memory device 302 includes packaging in the form of molding on top of substrate 312. The molding or packaging includes conductive epoxy 342, which represents a molding that has electrical conductivity. Conductive epoxy 342 is electrically connected to system ground through ground via 362, extension 382, and grounded perimeter ball 372. Via 362 represents a via or opening through substrate 312.

The molding can be epoxy resin that is deposited on the device, and allowed to cure (e.g., through chemical processes, thermal processes, or a combination of chemical and thermal processes). The epoxy resin cures or sets into the molding that provides the packaging of the memory device.

It will be understood that having a conductive epoxy in direct contact with memory die 322 may be undesirable due to a shorting electrical connection. In one example, memory device 302 includes epoxy mold 332 in direct contact with memory die 322, which can cover the die and wirebonds that are not connected to ground. In one example, wirebonds that are connected to ground can extend into physical contact with conductive epoxy 342.

In one example, memory die 322 can be flip-chip mounted to substrate 312, which can provide electrical connection to traces and via on the die-mounting surface of substrate 312. Such a flip-chip connection may expose fewer or no open electrical paths, which could enable the use of conductive epoxy for the entire molding in one implementation. For example, traces could be covered with electrically non-conductive coating prior to application of the conductive epoxy 342.

It will be understood that the diagram of memory device 302 is representative of the perimeter ground ball and other balls of the BGA, but is not necessarily to scale. For example, there may be more than eight columns or rows of BGA balls.

In one example, memory device 302 is a DRAM device package. In one example, conductive epoxy 342 is a layer of conductive epoxy over an existing mold represented by epoxy mold 332, which can be traditional packaging or molding for the DRAM device. In one example, via 362 is specifically a ground via, and thus, conductive epoxy 342 can be electrically connected to perimeter ball 372 through GND via 362.

In one example, via 362 is pre-filled with metal or conductor that the epoxy connects to on the top of substrate 312. In one example, via 362 is open, and conductive epoxy 342 flows into the via to make electrical contact with perimeter ball 372. In one example where the epoxy flows into via 362, the via can be lined with conductor.

The use of extension 382 allows the electrical connection of conductive epoxy 342 to ground, while enabling memory device 302 to have a smaller BGA ball map or smaller BGA footprint relative to a device in which all BGA balls are vertically aligned with vias in the memory device substrate.

Figure 3B:
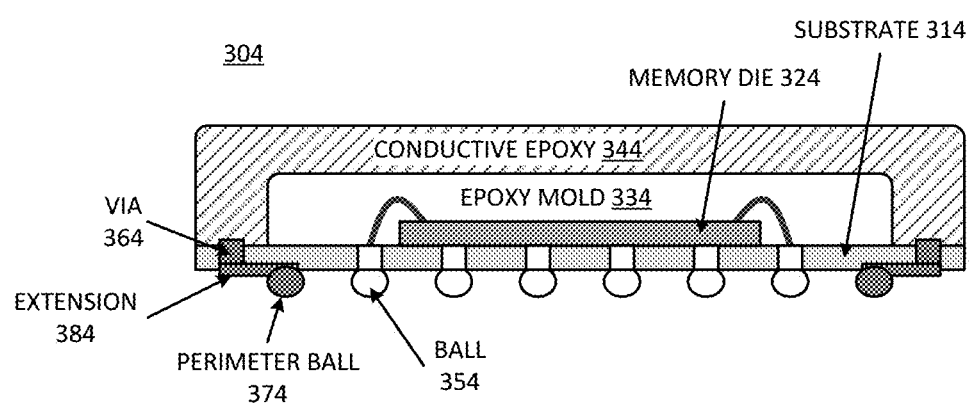
FIG. 3B is a circuit diagram of a cut away view of an example of a memory device with a conductive device molding grounded through a trace extension from a via to a perimeter ball that is coupled to the memory die.

FIG. 3B is a circuit diagram of a cut away view of an example of a memory device with a conductive device molding grounded through a trace extension from a via to a perimeter ball that is coupled to the memory die. Memory device 304 provides an example of a memory device similar to memory device 200 of FIG. 2A. Memory device 304 includes substrate 314, which represents a structural and electrical connection element for memory device 304. Substrate 314 provides a physical structure on which to mount memory die 324. Substrate 314 also provides electrical connection of memory die 324 to other elements.

Memory die 324 represents a memory chip or a bare memory die. For example, the bare memory die can be a die cut from a wafer of devices. Typically, the bare die includes one or more connection points to connect electrical points on memory die 324 to the external connectors of memory device 304. In one example, memory die 324 includes connection points on top of the die to which are connected to corresponding connection points on substrate 314. In an alternative example, memory die 324 is flip-chip mounted to substrate 314.

Substrate 314 includes vias from the side on which memory die 324 is mounted to the side (typically referred to as the "bottom side") of the memory device 304, which allows it to mount to another substrate or board. Vias through substrate 314 provide connection for traces or wire bonds to connect to balls of a ball grid array (BGA). A wire bond refers to a wire that connects from a connection point on memory die 324 to a connection point on substrate 314. Via 364 specifically provides a connection of conductive epoxy 344 to perimeter ball 374, which is to connect to a ground connection.

Substrate 314 can be considered to have a first surface and a second surface. While the orientation is arbitrary, the first surface can refer to the top surface on which memory die 324 is mounted. The second surface can refer to the opposite surface, which is the surface connected to the BGA balls, and which is the mounting surface of memory device 304, with electrical and signal connections. The vias pass through from the one surface to the other surface. From a different perspective, the second surface could be considered the surface to which memory die 324 is mounted, and the first surface could be considered the surface having the BGA balls.

For the cutaway view of device 304, the thin lines from memory die 324 to the darker vias 364 represent wirebonds. Perimeter ball 374 represents a ground ball, which is a ball to connect to a corresponding ground connection of a board or substrate to which device 304 will connect. Ball 354 represents any ball for a connection other than a perimeter ground connection to ground conductive epoxy 344. In one example, perimeter ball 374 represents dedicated perimeter ground balls, which provide a grounding perimeter around the packaging of memory device 304.

As illustrated, perimeter ball 374 is not vertically aligned with via 364. In one example, conductive epoxy 344 extends beyond the footprint of the BGA of device 304. In one example, device 304 includes extension 384 to electrically couple via 364 to perimeter ball 374. Extension 384 can represent any metal, conductor, trace, wire, or other electrical connection to provide the electrical connection of conductive epoxy 344 to perimeter ball 374. Extension 384 extends horizontally to connect a via that is not vertically aligned to a corresponding ground ball.

Memory device 304 includes packaging in the form of molding on top of substrate 314. The molding or packaging includes conductive epoxy 344, which represents a molding that has electrical conductivity. Conductive epoxy 344 is electrically connected to system ground through ground via 364, extension 384, and grounded perimeter ball 374. Via 364 represents a via or opening through substrate 314. In one example, connection points of memory die 324 do not connect to perimeter ball 374 through wirebond connection. In one example, perimeter ball 374 represents dedicated perimeter ground balls, which provide a grounding perimeter around the packaging of memory device 304.

The molding can be epoxy resin that is deposited on the device, and allowed to cure (e.g., through chemical processes, thermal processes, or a combination of chemical and thermal processes). The epoxy resin cures or sets into the molding that provides the packaging of the memory device. The epoxy resin can cover the devices as well as flowing into open vias.

It will be understood that having a conductive epoxy in direct contact with memory die 324 may be undesirable due to a shorting electrical connection. In one example, memory device 304 includes epoxy mold 334 in direct contact with memory die 324, which can cover the die and wirebonds that are not connected to ground. In one example, wirebonds that are connected to ground can extend into physical contact with conductive epoxy 344.

In one example, memory die 324 can be flip-chip mounted to substrate 314, which can provide electrical connection to conductive traces and via on the die-mounting surface of substrate 314. Such a flip-chip connection may expose fewer or no open electrical paths, which could enable the use of conductive epoxy for the entire molding in one implementation. For example, traces could be covered with electrically non-conductive coating prior to application of the conductive epoxy 344.

It will be understood that the diagram of memory device 304 is representative of the perimeter ground ball and other balls of the BGA, but is not necessarily to scale. For example, there may be more than eight columns or rows of BGA balls.

In one example, memory device 304 is a DRAM device package. In one example, conductive epoxy 344 is a layer of conductive epoxy over an existing mold represented by epoxy mold 334, which can be traditional packaging or molding for the DRAM device. In one example, via 364 is specifically a ground via, and thus, conductive epoxy 344 can be electrically connected to perimeter ball 374 through GND via 364.

In one example, via 364 is pre-filled with metal or conductor that the epoxy connects to on the top of substrate 314. In one example, via 364 is open, and conductive epoxy 344 flows into the via to make electrical contact with perimeter ball 374. In one example where the epoxy flows into via 364, the via can be lined with conductor.

The use of extension 384 allows the electrical connection of conductive epoxy 344 to ground, while enabling memory device 304 to have a smaller BGA ball map or smaller BGA footprint relative to a device in which all BGA balls are vertically aligned with vias in the memory device substrate.

Figure 4A:
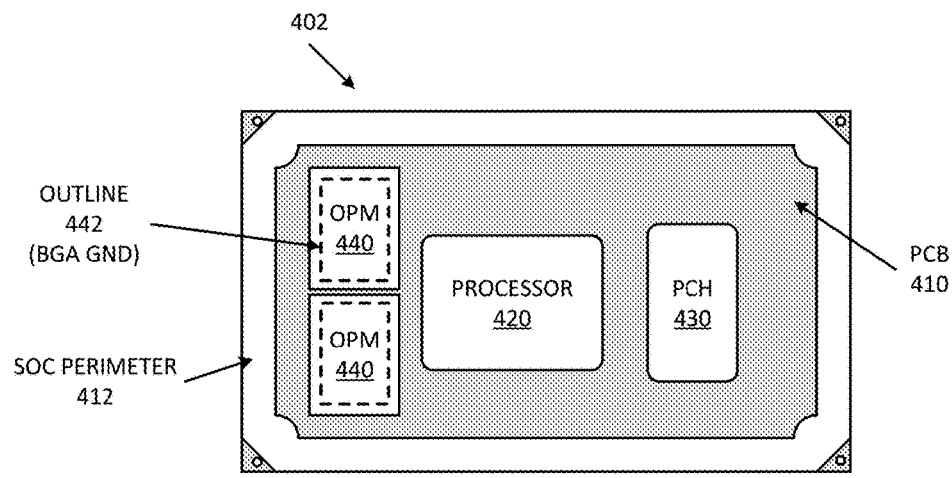
FIG. 4A is a block diagram of an example of a processor system on a chip (SOC) with on-package memory.

FIG. 4A is a block diagram of an example of a processor system on a chip (SOC) with on-package memory. System 402 represents a processor SOC or CPU (central processing unit) assembly with integrated system memory. System 402 includes PCB (printed circuit board) 410 or other substrate. PCB 410 enables the connection of multiple I/C (integrated circuit) devices together on a common substrate. In one example, the I/C devices can be packaged devices. In one example, PCB 410 includes a conductive perimeter, represented by SOC perimeter 412. SOC perimeter 412 can provide grounding for heat removal from system 402.

Processor 420 represents a processor device to perform operations in a computing system, such as a PC device. Processor 420 can execute instructions, including running a host operating system to manage the computing system into which it is integrated. PCH (peripheral control hub) 430 represents an I/C with circuitry to manage connections to peripherals, such as graphics, user input devices, storage devices, or other peripherals, or a combination. PCH 430 can provide interface functions between processor 420 and the peripheral components.

In one example, system 402 includes OPM (on-package memory) 440, which represents a memory device integrated onto PCB 410 with processor 420. OPM 440 provides an example of a self-shielded memory device in accordance with any example described. For example, OPM 440 can be in accordance with memory device 100 of FIG. 1A, memory device 200 of FIG. 2A, memory device 302 of FIG. 3A, or memory device 304 of FIG. 3B.

OPM 440 includes a solid outer line, which can represent the outer edge of the device packaging. OPM 440 includes a conductive packaging to be grounded to system ground of system 402. The dashed lines of OPM 440 represent outline 442, which is an outline of the BGA having the ground balls to which the conductive packaging is electrically connected. Thus, OPM 440 can include a grounded conductive packaging, which can provide noise shielding from electromagnetic (EM) radiation emitted due to high-frequency/high-speed operation of the memory.

Figure 4B:
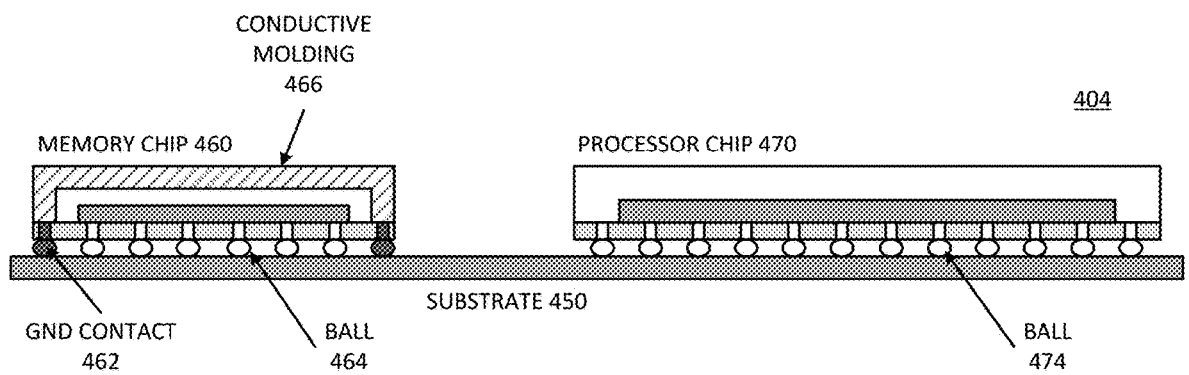
FIG. 4B is a circuit diagram of a cut away view of an example of a processor system on a chip (SOC) with on-package memory.

FIG. 4B is a circuit diagram of a cut away view of an example of a processor system on a chip (SOC) with on-package memory. System 404 provides an example of a system in accordance with system 402 of FIG. 4A. More specifically, system 404 provide a cutaway view of a memory device mounted on the same SOC as a processor device.

System 404 includes substrate 450, which represents a substrate, such as a PCB. Substrate 450 includes traces or other electrical connections to transmit signals between components coupled to the substrate.

Memory chip 460 represents an on-package memory, and more specifically, represents a self-shielded memory device. Memory chip 460 includes a memory die (not specifically labeled), and conductive molding 466. Conductive molding 466 connects to system ground for system 404 through a via and perimeter ground ball, which together provide ground (GND) contact 462. Ball 464 represents other BGA connections, other than the perimeter ground connection to ground conductive molding 466. While not specifically illustrated, in one example, ground contact 462 can include an extension in addition to the via and ground ball.

Processor chip 470 represents a processor device. Ball 474 represents connections from a processor die to connection points on substrate 450. In one example, processor chip 470 includes balls or connectors that connect to ground on substrate 450, which is the ground reference to which ground contact 462 connects.

Substrate 450 includes a surface to which the components are mounted, which could be referred to as a first surface or a second surface, with the opposite surface being the other of the first or second surface. In one example, substrate 450 connects into a computer system through a BGA or other connectors. The BGA balls or other connectors (which could be edge connectors, for example) for substrate 450 are not specifically illustrated. The bottom surface of substrate 450 is opposite the surface to which memory chip 460 and processor chip 470 are mounted.

In one example, substrate 450 includes a PCH or comparable circuitry, which is not specifically illustrated. In one example, substrate 450 includes connectors to connect to a nonvolatile memory device. In one example, substrate 450 includes connectors to connect to a display device. In one example, substrate 450 includes connectors to connect to a network interface. In one example, substrate 450 includes connectors to connect to a battery to power the processor chip or the CPU or SOC package.

Figure 5:
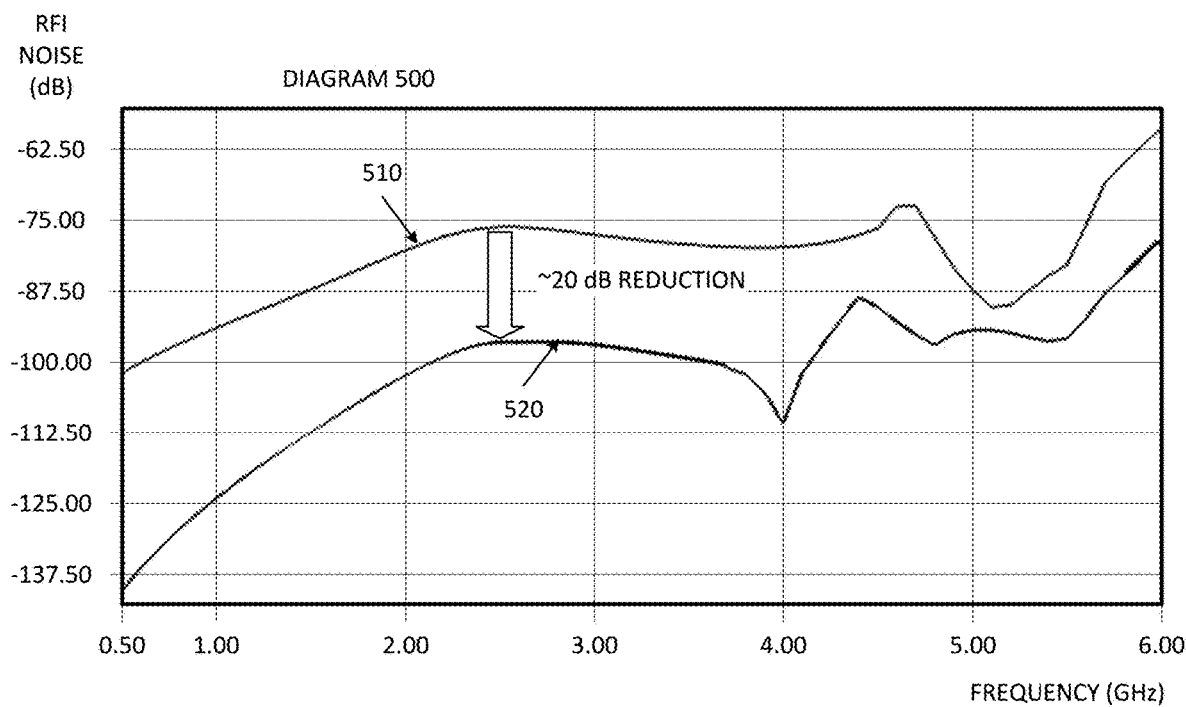
FIG. 5 is a representation of an example of a noise coupling coefficient showing reduction with a grounded packaging.

FIG. 5 is a representation of an example of a noise coupling coefficient showing reduction with a grounded packaging. Diagram 500 illustrates frequency in GHz (gigahertz) versus RFI (radio frequency interference) noise in dB (decibel). Curve 510 represents an RFI response for a traditional, non-shielded memory integrated onto a processor package. Curve 520 represents an RFI response for a self-shielded on-package memory, in accordance with an example of a self-shielded memory as described herein.

Curves 510 and 520 represent electromagnetic simulations. Memory noise coupling to an antenna is significantly reduced in curve 520 relative to curve 510. The noise reduction is close to 20 dB in a broad frequency range, covering all LTE (long-term evolution) and Wi-Fi bands. Significantly for the simulation curves of diagram 500, curve 520 representing the self-shielded device has very similar noise response to traditional shielding techniques, such as sputter metal layer shielding.

Figure 6:
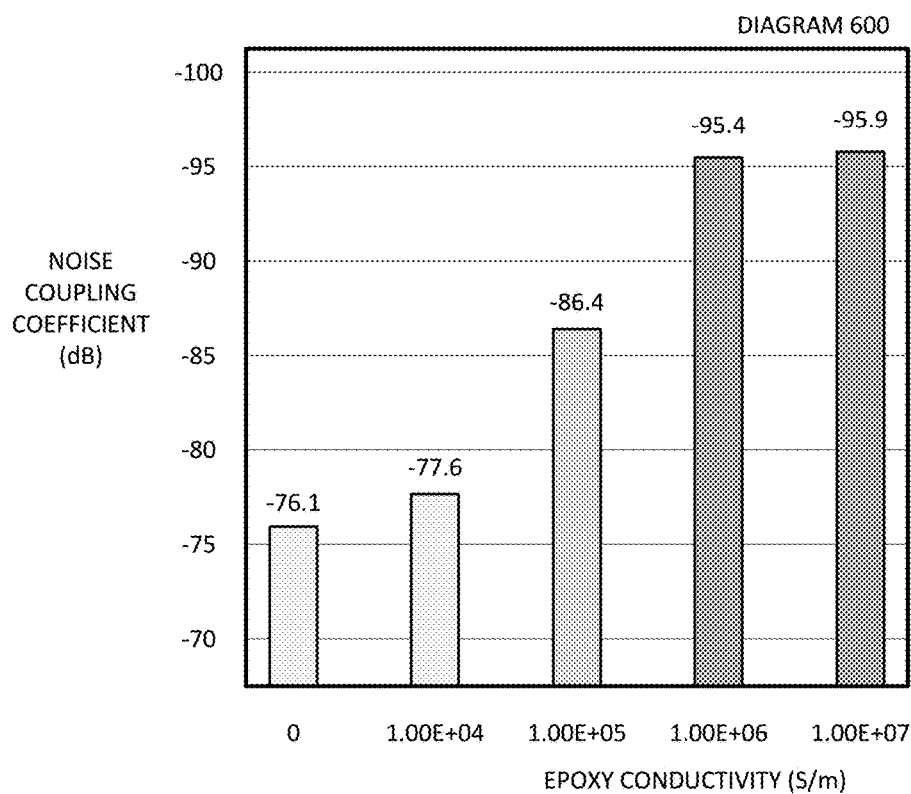
FIG. 6 is a representation of an example of package epoxy conductivity versus noise couple coefficient.

FIG. 6 is a representation of an example of package epoxy conductivity versus noise couple coefficient. Electrical conductivity of the conductive epoxy layer can be characterized in terms of shielding effectiveness. Diagram 600 illustrates shielding effectiveness for different epoxy conductivity.

Diagram 600 graphs epoxy conductivity in S/m (Siemens per meter) versus noise coupling coefficient in dB. For the noise coupling coefficient, the greater negative coupling, the more effective the shielding. The first bar in diagram 600 represents the case of no shielding, with a coefficient of −76.1 dB. Use of an epoxy resin having a conductivity of $1\times10^4$ S/m resulted in a coefficient of −77.6 dB.

In one example, the conductivity of the epoxy resin results from conductive particles in the resin. The conductivity can be controlled by controlling either the concentration of particles in the resin, or the type of particles, or both the type and concentration of conductive particles.

It can be observed that with a conductivity of at least $1\times10^5$ S/m, >10 dB noise shielding is achievable. With a conductivity of $1\times10^5$ S/m, the resultant coefficient is −86.4 dB. A conductivity of $1\times10^6$ S/m resulted in a coefficient of −95.4 dB, which is approximately 20 dB improvement. Increasing the conductivity to $1\times10^7$ S/m, resulted in a coefficient of −95.9, which is also approximately 20 dB improvement, but not significantly improved over a conductivity of $1\times10^6$/m. Overall the results indicate that the percentage of metal particles in a conductive epoxy resin can be controlled to obtain a desired shielding performance.

Figure 7:
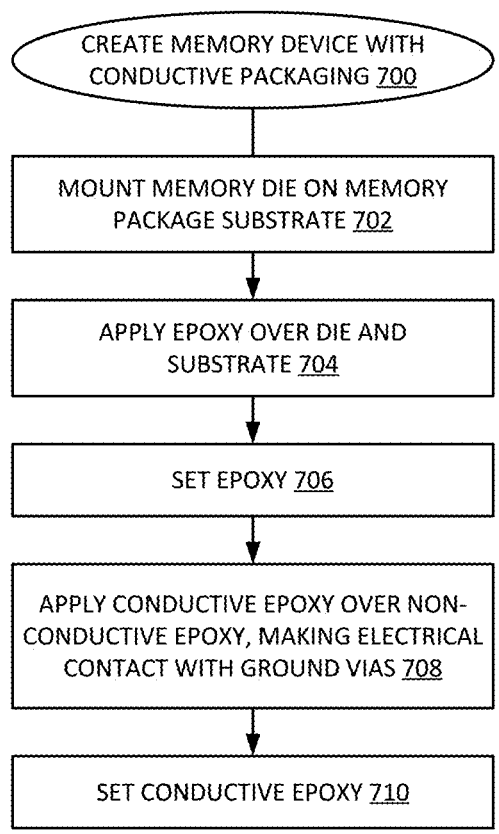
FIG. 7 is a flow diagram of an example of a process for creating a grounded conductive memory package.

FIG. 7 is a flow diagram of an example of a process for creating a grounded conductive memory package. Process 700 represents a process to create a self-shielded memory device in accordance with any self-shielded memory device described. More specifically, process 700 represents a process to create a memory device with a conductive packaging that is grounded to provide memory noise shielding.

The manufacturing includes mounting a memory die on a memory package substrate, at 702. In one example, mounting the memory die includes mounting the memory die and applying wirebond connections from connection points of the memory die to connection points on the substrate. The connection points on the memory package substrate connects to a ball grid array to provide a pinout for signal connections to the memory device. In one example, the memory die can be flip-chip mounted to the package substrate.

In one example, the manufacturing includes applying epoxy over the die and the substrate, at 704. The epoxy over the die and substrate can include a non-conductive epoxy resin that sets into a traditional memory package molding. The manufacturing includes setting the epoxy, at 706.

The manufacturing includes applying a conductive epoxy. In one example, applying the conductive epoxy includes application of the conductive epoxy over the non-conductive epoxy, making electrical contact of the conductive epoxy with ground vias, at 708. The electrical contact of the conductive epoxy with the ground vias can include contact with dedicated ground vias, with ground vias to connect to standard ground connections, contact with a via that connects to a ground ball directly or through an extension, or some other contact to ground the conductive epoxy.

The manufacturing sets the conductive epoxy, which can complete the memory device packaging, at 710. The memory device is then a self-shielded memory device that can be integrated onto a processor subsystem as on-package memory.

Figure 8:
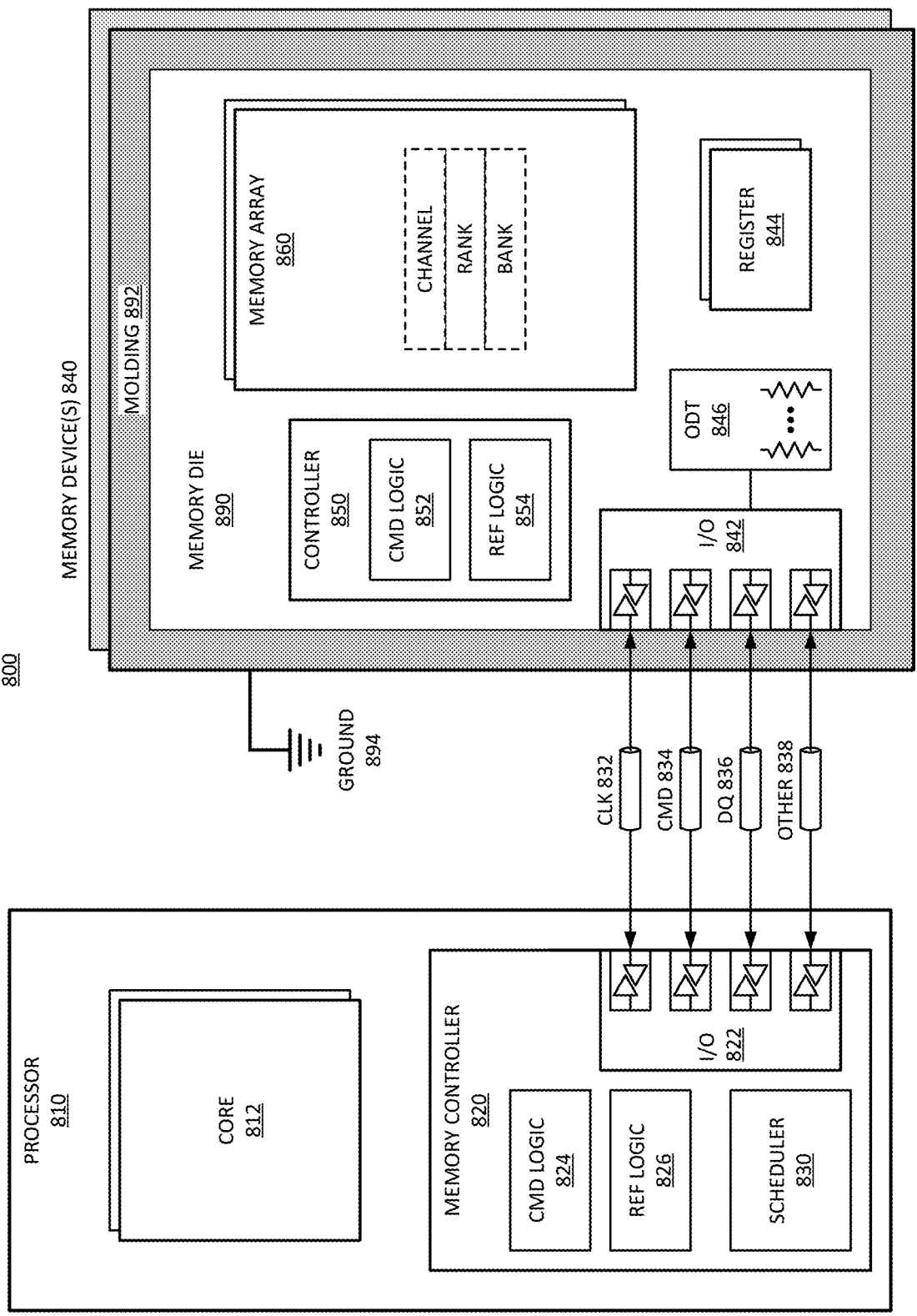
FIG. 8 is a block diagram of an example of a memory subsystem in which a grounded conductive memory package can be implemented.

FIG. 8 is a block diagram of an example of a memory subsystem in which a grounded conductive memory package can be implemented. System 800 includes a processor and elements of a memory subsystem in a computing device. System 800 provides an example of a system with a self-shielded memory device in accordance with memory device 100 of FIG. 1A, memory device 200 of FIG. 2A, memory device 302 of FIG. 3A, or memory device 304 of FIG. 3B.

In one example, system 800 includes memory devices 840 with molding 892. Molding 892 represents a conductive packaging in accordance with any description herein. Memory devices 840 include molding 892, and vias through a memory substrate to perimeter ground balls of a memory array. The ground balls are to connect to system ground 894. The grounded molding provides memory noise shielding. In one example, the self-shielded memory devices 840 enable integration of memory into a processor subsystem with processor 810 with reduced memory noise interference. Each memory device 840 can include one or more memory dies 890, a substrate with vias (not specifically illustrated in system 800), and molding 892 to connect to system ground 894 to ground the conductive molding.

Processor 810 represents a processing unit of a computing platform that may execute an operating system (OS) and applications, which can collectively be referred to as the host or the user of the memory. The OS and applications execute operations that result in memory accesses. Processor 810 includes one or more cores 812, which represent processing unit circuitry of processor 810. In one example, processor 810 is a multicore processing unit. In one example, processor 810 represents a primary processor such as a CPU (central processing unit). In one example, processor 810 represents a peripheral processor such as a GPU (graphics processing unit). System 800 represents one example of an SOC with integrated memory controller and on-package memory.

In one example, system 800 represents a system on a chip (SOC) in which processor 810, memory device(s) 840, and peripheral or connecting devices are all on a common substrate. The system on a chip can include an SOC can include an SOC substrate on which various devices are mounted. In one example, the SOC substrate includes mounting areas for BGA connections for memory devices, for processor devices, or for other components. Multiple components can be connected to the SOC substrate via BGA connectors.

Reference to memory devices can apply to different memory types. Memory devices often refers to volatile memory technologies. Volatile memory is memory whose state (and therefore the data stored on it) is indeterminate if power is interrupted to the device. Nonvolatile memory refers to memory whose state is determinate even if power is interrupted to the device. Dynamic volatile memory requires refreshing the data stored in the device to maintain state. One example of dynamic volatile memory includes DRAM (dynamic random access memory), or some variant such as synchronous DRAM (SDRAM). A memory subsystem as described herein may be compatible with a number of memory technologies, such as DDR4 (double data rate (DDR) version 4, JESD79-4, originally published in September 2012 by JEDEC), LPDDR4 (low power DDR version 4, JESD209-4, originally published by JEDEC in August 2014), WI02 (Wide I/O 2 (WideIO2), JESD229-2, originally published by JEDEC in August 2014), HBM (high bandwidth memory DRAM, JESD235A, originally published by JEDEC in November 2015), DDR5 (DDR version 5, currently in discussion by JEDEC), LPDDR5 (LPDDR version 5, JESD209-5, originally published by JEDEC in February 2019), HBM2 ((HBM version 2), currently in discussion by JEDEC), or others or combinations of memory technologies, and technologies based on derivatives or extensions of such specifications.

In one example, reference to memory devices can refer to a nonvolatile memory device whose state is determinate even if power is interrupted to the device. In one example, the nonvolatile memory device is a block addressable memory device, such as NAND or NOR technologies. Thus, a memory device can also include a future generation nonvolatile devices, such as a three dimensional crosspoint memory device, other byte addressable nonvolatile memory devices. A memory device can include a nonvolatile, byte addressable media that stores data based on a resistive state of the memory cell, or a phase of the memory cell. In one example, the memory device can use chalcogenide phase change material (e.g., chalcogenide glass). In one example, the memory device can be or include multi-threshold level NAND flash memory, NOR flash memory, single or multi-level phase change memory (PCM) or phase change memory with a switch (PCMS), a resistive memory, nanowire memory, ferroelectric transistor random access memory (FeTRAM), magnetoresistive random access memory (MRAM) memory that incorporates memristor technology, or spin transfer torque (STT)-MRAM, or a combination of any of the above, or other memory.

Memory controller 820 represents one or more memory controller circuits or devices for system 800. In one example, memory controller 820 is integrated onto a processor die or processor package of processor 810. Memory controller 820 represents control logic that generates memory access commands in response to the execution of operations by processor 810. Memory controller 820 accesses one or more memory devices 840. Memory devices 840 can be DRAM devices in accordance with any referred to above. In one example, memory devices 840 are organized and managed as different channels, where each channel couples to buses and signal lines that couple to multiple memory devices in parallel. Each channel is independently operable. Thus, each channel is independently accessed and controlled, and the timing, data transfer, command and address exchanges, and other operations are separate for each channel. Coupling can refer to an electrical coupling, communicative coupling, physical coupling, or a combination of these. Physical coupling can include direct contact. Electrical coupling includes an interface or interconnection that allows electrical flow between components, or allows signaling between components, or both. Communicative coupling includes connections, including wired or wireless, that enable components to exchange data.

In one example, settings for each channel are controlled by separate mode registers or other register settings. In one example, each memory controller 820 manages a separate memory channel, although system 800 can be configured to have multiple channels managed by a single controller, or to have multiple controllers on a single channel. In one example, memory controller 820 is part of host processor or host processor device 810, such as logic implemented on the same die or implemented in the same package space as the processor.

Memory controller 820 includes I/O interface logic 822 to couple to a memory bus, such as a memory channel as referred to above. I/O interface logic 822 (as well as I/O interface logic 842 of memory device 840) can include pins, pads, connectors, signal lines, traces, or wires, or other hardware to connect the devices, or a combination of these. I/O interface logic 822 can include a hardware interface. As illustrated, I/O interface logic 822 includes at least drivers/transceivers for signal lines. Commonly, wires within an integrated circuit interface couple with a pad, pin, or connector to interface signal lines or traces or other wires between devices. I/O interface logic 822 can include drivers, receivers, transceivers, or termination, or other circuitry or combinations of circuitry to exchange signals on the signal lines between the devices. The exchange of signals includes at least one of transmit or receive. While shown as coupling I/O 822 from memory controller 820 to I/O 842 of memory device 840, it will be understood that in an implementation of system 800 where groups of memory devices 840 are accessed in parallel, multiple memory devices can include I/O interfaces to the same interface of memory controller 820. In an implementation of system 800 including one or more memory modules, I/O 842 can include interface hardware of the memory module in addition to interface hardware on the memory device itself. Other memory controllers 820 will include separate interfaces to other memory devices 840.

The bus between memory controller 820 and memory devices 840 can be implemented as multiple signal lines coupling memory controller 820 to memory devices 840. The bus may typically include at least clock (CLK) 832, command/address (CMD) 834, and write data (DQ) and read data (DQ) 836, and zero or more other signal lines 838. In one example, a bus or connection between memory controller 820 and memory can be referred to as a memory bus. In one example, the memory bus is a multi-drop bus. The signal lines for CMD can be referred to as a "C/A bus" (or ADD/CMD bus, or some other designation indicating the transfer of commands (C or CMD) and address (A or ADD)

information) and the signal lines for write and read DQ can be referred to as a "data bus." In one example, independent channels have different clock signals, C/A buses, data buses, and other signal lines. Thus, system 800 can be considered to have multiple "buses," in the sense that an independent interface path can be considered a separate bus. It will be understood that in addition to the lines explicitly shown, a bus can include at least one of strobe signaling lines, alert lines, auxiliary lines, or other signal lines, or a combination. It will also be understood that serial bus technologies can be used for the connection between memory controller 820 and memory devices 840. An example of a serial bus technology is 8B10B encoding and transmission of high-speed data with embedded clock over a single differential pair of signals in each direction. In one example, CMD 834 represents signal lines shared in parallel with multiple memory devices. In one example, multiple memory devices share encoding command signal lines of CMD 834, and each has a separate chip select (CS_n) signal line to select individual memory devices.

It will be understood that in the example of system 800, the bus between memory controller 820 and memory devices 840 includes a subsidiary command bus CMD 834 and a subsidiary bus to carry the write and read data, DQ 836. In one example, the data bus can include bidirectional lines for read data and for write/command data. In another example, the subsidiary bus DQ 836 can include unidirectional write signal lines for write and data from the host to memory, and can include unidirectional lines for read data from the memory to the host. In accordance with the chosen memory technology and system design, other signals 838 may accompany a bus or sub bus, such as strobe lines DQS. Based on design of system 800, or implementation if a design supports multiple implementations, the data bus can have more or less bandwidth per memory device 840. For example, the data bus can support memory devices that have either a ×4 interface, a ×8 interface, a ×16 interface, or other interface. The convention "xW," where W is an integer that refers to an interface size or width of the interface of memory device 840, which represents a number of signal lines to exchange data with memory controller 820. The interface size of the memory devices is a controlling factor on how many memory devices can be used concurrently per channel in system 800 or coupled in parallel to the same signal lines. In one example, high bandwidth memory devices, wide interface devices, or stacked memory configurations, or combinations, can enable wider interfaces, such as a ×128 interface, a ×256 interface, a ×512 interface, a ×1024 interface, or other data bus interface width.

In one example, memory devices 840 and memory controller 820 exchange data over the data bus in a burst, or a sequence of consecutive data transfers. The burst corresponds to a number of transfer cycles, which is related to a bus frequency. In one example, the transfer cycle can be a whole clock cycle for transfers occurring on a same clock or strobe signal edge (e.g., on the rising edge). In one example, every clock cycle, referring to a cycle of the system clock, is separated into multiple unit intervals (UIs), where each UI is a transfer cycle. For example, double data rate transfers trigger on both edges of the clock signal (e.g., rising and falling). A burst can last for a configured number of UIs, which can be a configuration stored in a register, or triggered on the fly. For example, a sequence of eight consecutive transfer periods can be considered a burst length eight (BL8), and each memory device 840 can transfer data on each UI. Thus, a ×8 memory device operating on BL8 can transfer 84 bits of data (8 data signal lines times 8 data bits transferred per line over the burst). It will be understood that this simple example is merely an illustration and is not limiting.

Memory devices 840 represent memory resources for system 800. In one example, each memory device 840 is a separate memory die 890. In one example, each memory device 840 can interface with multiple (e.g., 2) channels per device or die. Each memory device 840 includes I/O interface logic 842, which has a bandwidth determined by the implementation of the device (e.g., ×16 or ×8 or some other interface bandwidth). I/O interface logic 842 enables the memory devices to interface with memory controller 820. I/O interface logic 842 can include a hardware interface, and can be in accordance with I/O 822 of memory controller, but at the memory device end. In one example, multiple memory devices 840 are connected in parallel to the same command and data buses. In another example, multiple memory devices 840 are connected in parallel to the same command bus, and are connected to different data buses. For example, system 800 can be configured with multiple memory devices 840 coupled in parallel, with each memory device responding to a command, and accessing memory resources 860 internal to each. For a Write operation, an individual memory device 840 can write a portion of the overall data word, and for a Read operation, an individual memory device 840 can fetch a portion of the overall data word. The remaining bits of the word will be provided or received by other memory devices in parallel.

In one example, memory devices 840 are disposed directly on a motherboard or host system platform (e.g., a PCB (printed circuit board) on which processor 810 is disposed) of a computing device. In one example, memory devices 840 may be incorporated onto the same substrate as processor 810 by techniques such as multi-chip-module (MCM), package-on-package, through-silicon via (TSV), or other techniques or combinations.

Memory dies 890 each include one or more memory arrays 860. Memory array 860 represents addressable memory locations or storage locations for data. Typically, memory array 860 is managed as rows of data, accessed via wordline (rows) and bitline (individual bits within a row) control. Memory array 860 can be organized as separate channels, ranks, banks, and partitions of memory. Channels may refer to independent control paths to storage locations within memory devices 840. Ranks may refer to common locations across multiple memory devices (e.g., same row addresses within different devices) in parallel. Banks may refer to sub-arrays of memory locations within a memory device 840. In one example, banks of memory are divided into sub-banks with at least a portion of shared circuitry (e.g., drivers, signal lines, control logic) for the sub-banks, allowing separate addressing and access. It will be understood that channels, ranks, banks, sub-banks, bank groups, or other organizations of the memory locations, and combinations of the organizations, can overlap in their application to physical resources. For example, the same physical memory locations can be accessed over a specific channel as a specific bank, which can also belong to a rank. Thus, the organization of memory resources will be understood in an inclusive, rather than exclusive, manner.

In one example, memory devices 840 include one or more registers 844. Register 844 represents one or more storage devices or storage locations that provide configuration or settings for the operation of the memory device. In one example, register 844 can provide a storage location for memory device 840 to store data for access by memory controller 820 as part of a control or management operation.

In one example, register 844 includes one or more Mode Registers. In one example, register 844 includes one or more multipurpose registers. The configuration of locations within register 844 can configure memory device 840 to operate in different "modes," where command information can trigger different operations within memory device 840 based on the mode. Additionally or in the alternative, different modes can also trigger different operation from address information or other signal lines depending on the mode. Settings of register 844 can indicate configuration for I/O settings (e.g., timing, termination or ODT (on-die termination) 846, driver configuration, or other I/O settings).

In one example, memory device 840 includes ODT 846 as part of the interface hardware associated with I/O 842. ODT 846 can be configured as mentioned above, and provide settings for impedance to be applied to the interface to specified signal lines. In one example, ODT 846 is applied to DQ signal lines. In one example, ODT 846 is applied to command signal lines. In one example, ODT 846 is applied to address signal lines. In one example, ODT 846 can be applied to any combination of the preceding. The ODT settings can be changed based on whether a memory device is a selected target of an access operation or a non-target device. ODT 846 settings can affect the timing and reflections of signaling on the terminated lines. Careful control over ODT 846 can enable higher-speed operation with improved matching of applied impedance and loading. ODT 846 can be applied to specific signal lines of I/O interface 842, 822 (for example, ODT for DQ lines or ODT for CA lines), and is not necessarily applied to all signal lines.

Memory device 840 includes controller 850, which represents control logic within the memory device to control internal operations within the memory device. For example, controller 850 decodes commands sent by memory controller 820 and generates internal operations to execute or satisfy the commands. Controller 850 can be referred to as an internal controller, and is separate from memory controller 820 of the host. Controller 850 can determine what mode is selected based on register 844, and configure the internal execution of operations for access to memory resources 860 or other operations based on the selected mode. Controller 850 generates control signals to control the routing of bits within memory device 840 to provide a proper interface for the selected mode and direct a command to the proper memory locations or addresses. Controller 850 includes command logic 852, which can decode command encoding received on command and address signal lines. Thus, command logic 852 can be or include a command decoder. With command logic 852, memory device can identify commands and generate internal operations to execute requested commands.

Referring again to memory controller 820, memory controller 820 includes command (CMD) logic 824, which represents logic or circuitry to generate commands to send to memory devices 840. The generation of the commands can refer to the command prior to scheduling, or the preparation of queued commands ready to be sent. Generally, the signaling in memory subsystems includes address information within or accompanying the command to indicate or select one or more memory locations where the memory devices should execute the command. In response to scheduling of transactions for memory device 840, memory controller 820 can issue commands via I/O 822 to cause memory device 840 to execute the commands. In one example, controller 850 of memory device 840 receives and decodes command and address information received via I/O 842 from memory controller 820. Based on the received command and address information, controller 850 can control the timing of operations of the logic and circuitry within memory device 840 to execute the commands. Controller 850 is responsible for compliance with standards or specifications within memory device 840, such as timing and signaling requirements. Memory controller 820 can implement compliance with standards or specifications by access scheduling and control.

Memory controller 820 includes scheduler 830, which represents logic or circuitry to generate and order transactions to send to memory device 840. From one perspective, the primary function of memory controller 820 could be said to schedule memory access and other transactions to memory device 840. Such scheduling can include generating the transactions themselves to implement the requests for data by processor 810 and to maintain integrity of the data (e.g., such as with commands related to refresh). Transactions can include one or more commands, and result in the transfer of commands or data or both over one or multiple timing cycles such as clock cycles or unit intervals. Transactions can be for access such as read or write or related commands or a combination, and other transactions can include memory management commands for configuration, settings, data integrity, or other commands or a combination.

Memory controller 820 typically includes logic such as scheduler 830 to allow selection and ordering of transactions to improve performance of system 800. Thus, memory controller 820 can select which of the outstanding transactions should be sent to memory device 840 in which order, which is typically achieved with logic much more complex that a simple first-in first-out algorithm. Memory controller 820 manages the transmission of the transactions to memory device 840, and manages the timing associated with the transaction. In one example, transactions have deterministic timing, which can be managed by memory controller 820 and used in determining how to schedule the transactions with scheduler 830.

In one example, memory controller 820 includes refresh (REF) logic 826. Refresh logic 826 can be used to refresh memory resources to retain a deterministic state. Volatile memory resources need to be refreshed regularly to maintain state, while nonvolatile memory resources may need to be refreshed to avoid read/write disturb. In one example, refresh logic 826 indicates a location for refresh, and a type of refresh to perform. Refresh logic 826 can trigger self-refresh within memory device 840, or execute external refreshes (which can be referred to as auto refresh commands) by sending refresh commands, or a combination. In one example, controller 850 within memory device 840 includes refresh logic 854 to apply refresh within memory device 840. Refresh logic 854 generates internal operations to perform refresh either internally, or in accordance with an external refresh received from memory controller 820.

Figure 9:
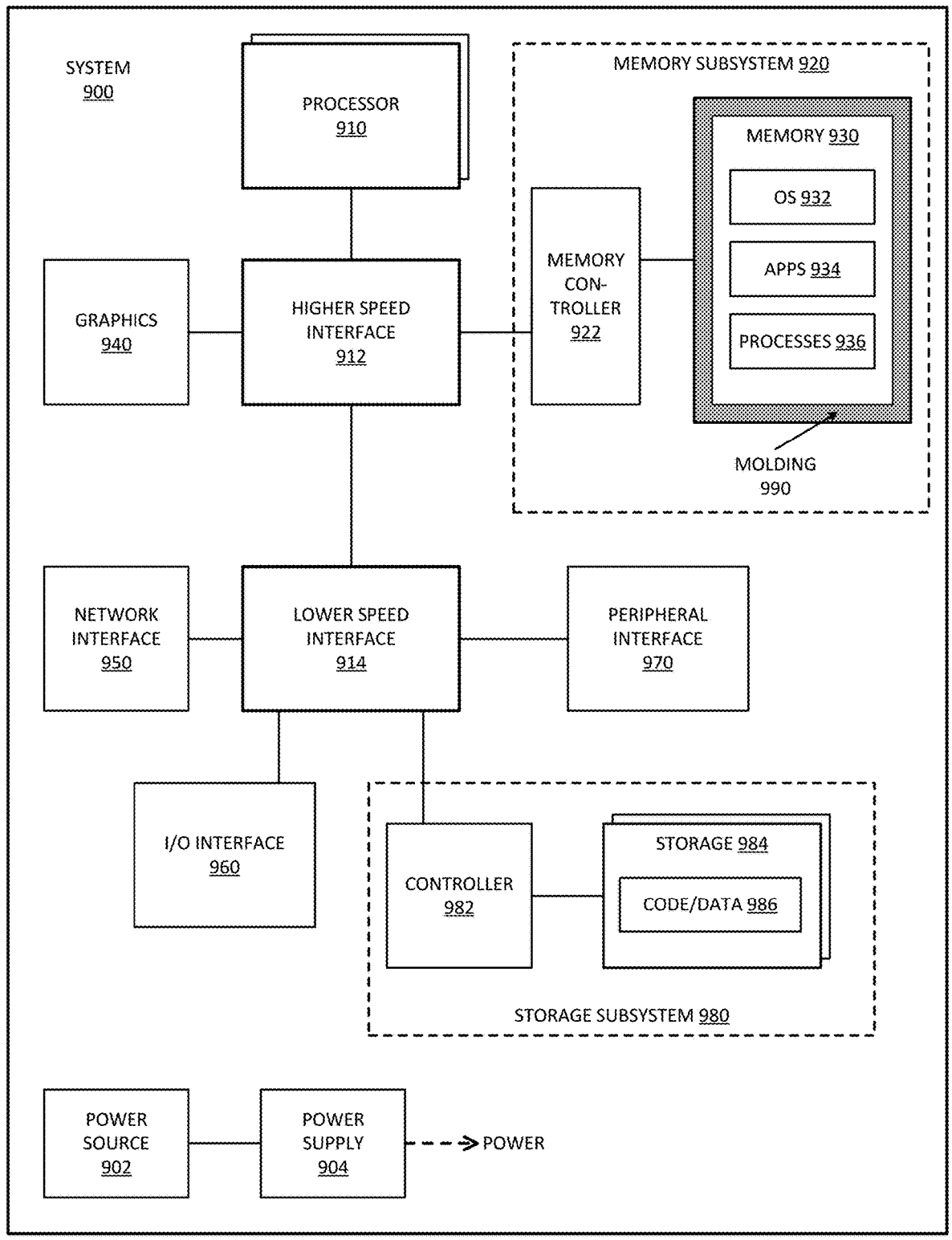
FIG. 9 is a block diagram of an example of a computing system in which a grounded conductive memory package can be implemented.

FIG. 9 is a block diagram of an example of a computing system in which a grounded conductive memory package can be implemented. System 900 represents a computing device in accordance with any example herein, and can be a laptop computer, a desktop computer, a tablet computer, a server, a gaming or entertainment control system, embedded computing device, or other electronic device. System 800 provides an example of a system with a self-shielded memory device in accordance with memory device 100 of FIG. 1A, memory device 200 of FIG. 2A, memory device 302 of FIG. 3A, or memory device 304 of FIG. 3B.

In one example, system 900 includes memory 930 with molding 990. Molding 990 represents a conductive packaging in accordance with any description herein. Memory 930 includes molding 990, and vias through a memory substrate to perimeter ground balls of a memory array. The grounded molding provides memory noise shielding. In one example, the self-shielded memory 930 enables integration of memory subsystem 920 into a processor subsystem with processor 910.

System 900 includes processor 910 can include any type of microprocessor, central processing unit (CPU), graphics processing unit (GPU), processing core, or other processing hardware, or a combination, to provide processing or execution of instructions for system 900. Processor 910 controls the overall operation of system 900, and can be or include, one or more programmable general-purpose or special-purpose microprocessors, digital signal processors (DSPs), programmable controllers, application specific integrated circuits (ASICs), programmable logic devices (PLDs), or a combination of such devices.

In one example, system 900 includes interface 912 coupled to processor 910, which can represent a higher speed interface or a high throughput interface for system components that need higher bandwidth connections, such as memory subsystem 920 or graphics interface components 940. Interface 912 represents an interface circuit, which can be a standalone component or integrated onto a processor die. Interface 912 can be integrated as a circuit onto the processor die or integrated as a component on a system on a chip. Where present, graphics interface 940 interfaces to graphics components for providing a visual display to a user of system 900. Graphics interface 940 can be a standalone component or integrated onto the processor die or system on a chip. In one example, graphics interface 940 can drive a high definition (HD) display or ultra high definition (UHD) display that provides an output to a user. In one example, the display can include a touchscreen display. In one example, graphics interface 940 generates a display based on data stored in memory 930 or based on operations executed by processor 910 or both.

Memory subsystem 920 represents the main memory of system 900, and provides storage for code to be executed by processor 910, or data values to be used in executing a routine. Memory subsystem 920 can include one or more memory devices 930 such as read-only memory (ROM), flash memory, one or more varieties of random access memory (RAM) such as DRAM, 3DXP (three-dimensional crosspoint), or other memory devices, or a combination of such devices. Memory 930 stores and hosts, among other things, operating system (OS) 932 to provide a software platform for execution of instructions in system 900. Additionally, applications 934 can execute on the software platform of OS 932 from memory 930. Applications 934 represent programs that have their own operational logic to perform execution of one or more functions. Processes 936 represent agents or routines that provide auxiliary functions to OS 932 or one or more applications 934 or a combination. OS 932, applications 934, and processes 936 provide software logic to provide functions for system 900. In one example, memory subsystem 920 includes memory controller 922, which is a memory controller to generate and issue commands to memory 930. It will be understood that memory controller 922 could be a physical part of processor 910 or a physical part of interface 912. For example, memory controller 922 can be an integrated memory controller, integrated onto a circuit with processor 910, such as integrated onto the processor die or a system on a chip.

While not specifically illustrated, it will be understood that system 900 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a HyperTransport or industry standard architecture (ISA) bus, a small computer system interface (SCSI) bus, a universal serial bus (USB), or other bus, or a combination.

In one example, system 900 includes interface 914, which can be coupled to interface 912. Interface 914 can be a lower speed interface than interface 912. In one example, interface 914 represents an interface circuit, which can include standalone components and integrated circuitry. In one example, multiple user interface components or peripheral components, or both, couple to interface 914. Network interface 950 provides system 900 the ability to communicate with remote devices (e.g., servers or other computing devices) over one or more networks. Network interface 950 can include an Ethernet adapter, wireless interconnection components, cellular network interconnection components, USB (universal serial bus), or other wired or wireless standards-based or proprietary interfaces. Network interface 950 can exchange data with a remote device, which can include sending data stored in memory or receiving data to be stored in memory.

In one example, system 900 includes one or more input/output (I/O) interface(s) 960. I/O interface 960 can include one or more interface components through which a user interacts with system 900 (e.g., audio, alphanumeric, tactile/touch, or other interfacing). Peripheral interface 970 can include any hardware interface not specifically mentioned above. Peripherals refer generally to devices that connect dependently to system 900. A dependent connection is one where system 900 provides the software platform or hardware platform or both on which operation executes, and with which a user interacts.

In one example, system 900 includes storage subsystem 980 to store data in a nonvolatile manner. In one example, in certain system implementations, at least certain components of storage 980 can overlap with components of memory subsystem 920. Storage subsystem 980 includes storage device(s) 984, which can be or include any conventional medium for storing large amounts of data in a nonvolatile manner, such as one or more magnetic, solid state, 3DXP, or optical based disks, or a combination. Storage 984 holds code or instructions and data 986 in a persistent state (i.e., the value is retained despite interruption of power to system 900). Storage 984 can be generically considered to be a "memory," although memory 930 is typically the executing or operating memory to provide instructions to processor 910. Whereas storage 984 is nonvolatile, memory 930 can include volatile memory (i.e., the value or state of the data is indeterminate if power is interrupted to system 900). In one example, storage subsystem 980 includes controller 982 to interface with storage 984. In one example controller 982 is a physical part of interface 914 or processor 910, or can include circuits or logic in both processor 910 and interface 914.

Power source 902 provides power to the components of system 900. More specifically, power source 902 typically interfaces to one or multiple power supplies 904 in system 900 to provide power to the components of system 900. In one example, power supply 904 includes an AC to DC (alternating current to direct current) adapter to plug into a wall outlet. Such AC power can be renewable energy (e.g., solar power) power source 902. In one example, power source 902 includes a DC power source, such as an external AC to DC converter. In one example, power source 902 or power supply 904 includes wireless charging hardware to charge via proximity to a charging field. In one example, power source 902 can include an internal battery or fuel cell source.

Figure 10:
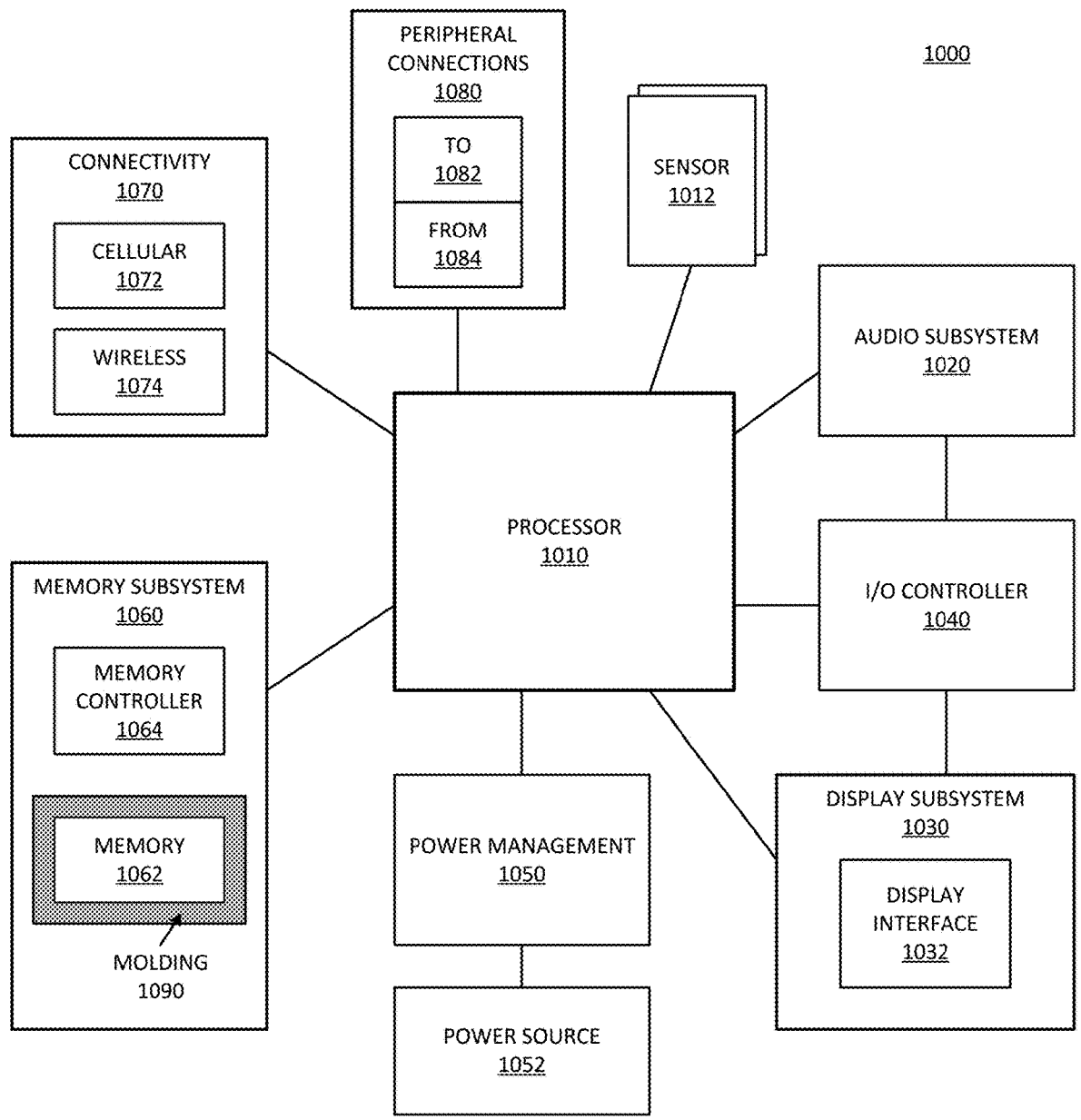
FIG. 10 is a block diagram of an example of a mobile device in which a grounded conductive memory package can be implemented.

FIG. 10 is a block diagram of an example of a mobile device in which a grounded conductive memory package can be implemented. System 1000 represents a mobile computing device, such as a computing tablet, a mobile phone or smartphone, wearable computing device, or other mobile device, or an embedded computing device. It will be understood that certain of the components are shown generally, and not all components of such a device are shown in system 1000. System 1000 provides an example of a system with a self-shielded memory device in accordance with memory device 100 of FIG. 1A, memory device 200 of FIG. 2A, memory device 302 of FIG. 3A, or memory device 304 of FIG. 3B.

In one example, system 1000 includes memory 1062 with molding 1090. Molding 1090 represents a conductive packaging in accordance with any description herein. Memory 1062 includes molding 1090, and vias through a memory substrate to perimeter ground balls of a memory array. The grounded molding provides memory noise shielding. In one example, the self-shielded memory 1062 enables integration of memory subsystem 1060 into a processor subsystem with processor 1010.

System 1000 includes processor 1010, which performs the primary processing operations of system 1000. Processor 1010 can include one or more physical devices, such as microprocessors, application processors, microcontrollers, programmable logic devices, or other processing means. The processing operations performed by processor 1010 include the execution of an operating platform or operating system on which applications and device functions are executed. The processing operations include operations related to I/O (input/output) with a human user or with other devices, operations related to power management, operations related to connecting system 1000 to another device, or a combination. The processing operations can also include operations related to audio I/O, display I/O, or other interfacing, or a combination. Processor 1010 can execute data stored in memory. Processor 1010 can write or edit data stored in memory.

In one example, system 1000 includes one or more sensors 1012. Sensors 1012 represent embedded sensors or interfaces to external sensors, or a combination. Sensors 1012 enable system 1000 to monitor or detect one or more conditions of an environment or a device in which system 1000 is implemented. Sensors 1012 can include environmental sensors (such as temperature sensors, motion detectors, light detectors, cameras, chemical sensors (e.g., carbon monoxide, carbon dioxide, or other chemical sensors)), pressure sensors, accelerometers, gyroscopes, medical or physiology sensors (e.g., biosensors, heart rate monitors, or other sensors to detect physiological attributes), or other sensors, or a combination. Sensors 1012 can also include sensors for biometric systems such as fingerprint recognition systems, face detection or recognition systems, or other systems that detect or recognize user features. Sensors 1012 should be understood broadly, and not limiting on the many different types of sensors that could be implemented with system 1000. In one example, one or more sensors 1012 couples to processor 1010 via a frontend circuit integrated with processor 1010. In one example, one or more sensors 1012 couples to processor 1010 via another component of system 1000.

In one example, system 1000 includes audio subsystem 1020, which represents hardware (e.g., audio hardware and audio circuits) and software (e.g., drivers, codecs) components associated with providing audio functions to the computing device. Audio functions can include speaker or headphone output, as well as microphone input. Devices for such functions can be integrated into system 1000, or connected to system 1000. In one example, a user interacts with system 1000 by providing audio commands that are received and processed by processor 1010.

Display subsystem 1030 represents hardware (e.g., display devices) and software components (e.g., drivers) that provide a visual display for presentation to a user. In one example, the display includes tactile components or touchscreen elements for a user to interact with the computing device. Display subsystem 1030 includes display interface 1032, which includes the particular screen or hardware device used to provide a display to a user. In one example, display interface 1032 includes logic separate from processor 1010 (such as a graphics processor) to perform at least some processing related to the display. In one example, display subsystem 1030 includes a touchscreen device that provides both output and input to a user. In one example, display subsystem 1030 includes a high definition (HD) or ultra-high definition (UHD) display that provides an output to a user. In one example, display subsystem includes or drives a touchscreen display. In one example, display subsystem 1030 generates display information based on data stored in memory or based on operations executed by processor 1010 or both.

I/O controller 1040 represents hardware devices and software components related to interaction with a user. I/O controller 1040 can operate to manage hardware that is part of audio subsystem 1020, or display subsystem 1030, or both. Additionally, I/O controller 1040 illustrates a connection point for additional devices that connect to system 1000 through which a user might interact with the system. For example, devices that can be attached to system 1000 might include microphone devices, speaker or stereo systems, video systems or other display device, keyboard or keypad devices, buttons/switches, or other I/O devices for use with specific applications such as card readers or other devices.

As mentioned above, I/O controller 1040 can interact with audio subsystem 1020 or display subsystem 1030 or both. For example, input through a microphone or other audio device can provide input or commands for one or more applications or functions of system 1000. Additionally, audio output can be provided instead of or in addition to display output. In another example, if display subsystem includes a touchscreen, the display device also acts as an input device, which can be at least partially managed by I/O controller 1040. There can also be additional buttons or switches on system 1000 to provide I/O functions managed by I/O controller 1040.

In one example, I/O controller 1040 manages devices such as accelerometers, cameras, light sensors or other environmental sensors, gyroscopes, global positioning system (GPS), or other hardware that can be included in system 1000, or sensors 1012. The input can be part of direct user interaction, as well as providing environmental input to the system to influence its operations (such as filtering for noise, adjusting displays for brightness detection, applying a flash for a camera, or other features).

In one example, system 1000 includes power management 1050 that manages battery power usage, charging of the battery, and features related to power saving operation. Power management 1050 manages power from power source 1052, which provides power to the components of system 1000. In one example, power source 1052 includes an AC to DC (alternating current to direct current) adapter to plug into a wall outlet. Such AC power can be renewable energy (e.g., solar power, motion based power). In one example, power source 1052 includes only DC power, which can be provided by a DC power source, such as an external AC to DC converter. In one example, power source 1052 includes wireless charging hardware to charge via proximity to a charging field. In one example, power source 1052 can include an internal battery or fuel cell source.

Memory subsystem 1060 includes memory device(s) 1062 for storing information in system 1000. Memory subsystem 1060 can include nonvolatile (state does not change if power to the memory device is interrupted) or volatile (state is indeterminate if power to the memory device is interrupted) memory devices, or a combination. Memory 1060 can store application data, user data, music, photos, documents, or other data, as well as system data (whether long-term or temporary) related to the execution of the applications and functions of system 1000. In one example, memory subsystem 1060 includes memory controller 1064 (which could also be considered part of the control of system 1000, and could potentially be considered part of processor 1010). Memory controller 1064 includes a scheduler to generate and issue commands to control access to memory device 1062.

Connectivity 1070 includes hardware devices (e.g., wireless or wired connectors and communication hardware, or a combination of wired and wireless hardware) and software components (e.g., drivers, protocol stacks) to enable system 1000 to communicate with external devices. The external device could be separate devices, such as other computing devices, wireless access points or base stations, as well as peripherals such as headsets, printers, or other devices. In one example, system 1000 exchanges data with an external device for storage in memory or for display on a display device. The exchanged data can include data to be stored in memory, or data already stored in memory, to read, write, or edit data.

Connectivity 1070 can include multiple different types of connectivity. To generalize, system 1000 is illustrated with cellular connectivity 1072 and wireless connectivity 1074. Cellular connectivity 1072 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), 5G, or other cellular service standards. Wireless connectivity 1074 refers to wireless connectivity that is not cellular, and can include personal area networks (such as Bluetooth), local area networks (such as WiFi), or wide area networks (such as WiMax), or other wireless communication, or a combination. Wireless communication refers to transfer of data through the use of modulated electromagnetic radiation through a non-solid medium. Wired communication occurs through a solid communication medium.

Peripheral connections 1080 include hardware interfaces and connectors, as well as software components (e.g., drivers, protocol stacks) to make peripheral connections. It will be understood that system 1000 could both be a peripheral device ("to" 1082) to other computing devices, as well as have peripheral devices ("from" 1084) connected to it. System 1000 commonly has a "docking" connector to connect to other computing devices for purposes such as managing (e.g., downloading, uploading, changing, synchronizing) content on system 1000. Additionally, a docking connector can allow system 1000 to connect to certain peripherals that allow system 1000 to control content output, for example, to audiovisual or other systems.

In addition to a proprietary docking connector or other proprietary connection hardware, system 1000 can make peripheral connections 1080 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), or other type.

In general with respect to the descriptions herein, in one example a memory device includes: a substrate having a first surface on which to mount a memory die, the substrate having ground vias through the substrate to a second surface of the substrate, opposite the first surface; a ball grid array (BGA) on the second surface having perimeter balls, including perimeter balls to connect to ground connections; and an electrically conductive epoxy mold to cover the first surface, the epoxy mold electrically connected to the ground vias.

In one example, the ground vias comprise vias filled with conductor to which the epoxy mold connects. In one example, the ground vias comprise open vias filled with epoxy resin. In one example, the substrate further comprising a conductive trace to connect at least one of the ground vias horizontally to one of the perimeter balls to connect to one of the ground connections not vertically aligned with the at least one of the ground vias. In one example, the epoxy mold comprises epoxy resin with conductive particles. In one example, the epoxy mold has a conductivity of at least $10^5$ Siemens/meter. In one example, the perimeter balls to connect to ground connections comprise perimeter ball to connect to ground connections spaced by no more than the speed of light constant over lambda over 10 ($c/(\lambda/10)$), where lambda represents a center frequency of noise to suppress. In one example, lambda comprises a frequency of 6 GHz. In one example, the memory device further comprising: an electrically non-conductive epoxy mold between the first surface and the electrically conductive epoxy mold.

In general with respect to the descriptions herein, in one example a central processing unit (CPU) includes: a system-on-a-chip (SOC) substrate; a processor core disposed on the SOC substrate; and an on-package memory device coupled to the processor core via the SOC substrate, the on-package memory device including: a memory substrate having a first surface on which to mount a memory die, the memory substrate having ground vias through the memory substrate to a second surface of the memory substrate, opposite the first surface; a ball grid array (BGA) on the second surface having perimeter balls, including perimeter balls to connect to ground connections on the SOC substrate; and an electrically conductive epoxy mold to cover the first surface, the epoxy mold electrically connected to the ground vias.

In one example, the ground vias comprise vias filled with conductor to which the epoxy mold connects. In one example, the ground vias comprise open vias filled with epoxy resin. In one example, the memory substrate further includes a conductive trace to connect at least one of the ground vias horizontally to one of the perimeter balls to connect to one of the ground connections not vertically aligned with the at least one of the ground vias. In one example, the epoxy mold comprises epoxy resin with conductive particles. In one example, the epoxy mold has a conductivity of at least 10^5 Siemens/meter. In one example, the perimeter balls to connect to ground connections comprise perimeter ball to connect to ground connections spaced by no more than the speed of light constant over lambda over 10 (c/(λ/10)), where lambda represents a center frequency of noise to suppress. In one example, lambda comprises a frequency of 6 GHz. In one example, the CPU includes: an electrically non-conductive epoxy mold between the first surface and the electrically conductive epoxy mold. In one example, the SOC substrate comprises: connectors to connect to a nonvolatile memory device; connectors to connect to a display device; connectors to connect to a network interface; or connectors to connect to a battery to power the CPU.

Flow diagrams as illustrated herein provide examples of sequences of various process actions. The flow diagrams can indicate operations to be executed by a software or firmware routine, as well as physical operations. A flow diagram can illustrate an example of the implementation of states of a finite state machine (FSM), which can be implemented in hardware and/or software. Although shown in a particular sequence or order, unless otherwise specified, the order of the actions can be modified. Thus, the illustrated diagrams should be understood only as examples, and the process can be performed in a different order, and some actions can be performed in parallel. Additionally, one or more actions can be omitted; thus, not all implementations will perform all actions.

To the extent various operations or functions are described herein, they can be described or defined as software code, instructions, configuration, and/or data. The content can be directly executable ("object" or "executable" form), source code, or difference code ("delta" or "patch" code). The software content of what is described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to what is disclosed and implementations of the invention without departing from their scope. Therefore, the illustrations and examples herein should be construed in an illustrative, and not a restrictive sense. The scope of the invention should be measured solely by reference to the claims that follow.

What is claimed is:

1. A memory device comprising:
a substrate having a first surface on which a memory die is mounted with bond wires, the substrate having ground vias through the substrate to a second surface of the substrate, opposite the first surface;
a ball grid array (BGA) on the second surface having perimeter balls, including perimeter ground balls to connect to ground connections where the perimeter ground balls do not all have the same spacing from one perimeter ground ball to a next closest perimeter ground ball, and wherein a spacing between any two perimeter ground balls is no more than the speed of light constant over lambda over 10 (c/(λ/10)), where lambda represents a center frequency of noise to suppress;
an electrically non-conductive epoxy mold directly in contact with the memory die, covering the memory die and a connection of the bond wires to the memory die; and
an electrically conductive epoxy mold to cover the electrically non-conductive epoxy mold as an outer-most package layer of the memory device, the electrically conductive epoxy mold electrically connected to the ground vias and the perimeter ground balls.

2. The memory device of claim 1, wherein the ground vias comprise vias filled with conductor to which the electrically conductive epoxy mold connects.

3. The memory device of claim 1, wherein the ground vias comprise open vias filled with epoxy resin.

4. The memory device of claim 1, the substrate further comprising a conductive trace to connect at least one of the ground vias horizontally to one of the perimeter ground balls to connect to one of the ground connections not vertically aligned with the at least one of the ground vias.

5. The memory device of claim 1, wherein the electrically conductive epoxy mold comprises epoxy resin with conductive particles.

6. The memory device of claim 5, wherein the electrically conductive epoxy mold has a conductivity of at least 105 Siemens/meter.

7. The memory device of claim 1, wherein lambda comprises a frequency of 6 GHz.

8. A central processing unit (CPU), comprising:
a system-on-a-chip (SOC) substrate;
a processor core disposed on the SOC substrate; and
an on-package memory device coupled to the processor core via the SOC substrate, the on-package memory device including:
a memory substrate having a first surface on which a memory die is mounted with bond wires, the memory substrate having ground vias through the memory substrate to a second surface of the memory substrate, opposite the first surface;
a ball grid array (BGA) on the second surface having perimeter balls, including perimeter ground balls to connect to ground connections where the perimeter ground balls do not all have the same spacing from one perimeter ground ball to a next closest perimeter ground ball, and wherein a spacing between any two perimeter ground balls is no more than the speed of light constant over lambda over 10 (c/(λ/10)), where lambda represents a center frequency of noise to suppress;

an electrically non-conductive epoxy mold directly in contact with the memory die, covering the memory die and a connection of the bond wires to the memory die; and an electrically conductive epoxy mold to cover the electrically non-conductive epoxy mold as an outermost package layer of the on-package memory device, the electrically conductive epoxy mold electrically connected to the ground vias and the perimeter ground balls.

9. The CPU of claim 8, wherein the ground vias comprise vias filled with conductor to which the electrically conductive epoxy mold connects.

10. The CPU of claim 8, wherein the ground vias comprise open vias filled with epoxy resin.

11. The CPU of claim 8, the memory substrate further comprising a conductive trace to connect at least one of the ground vias horizontally to one of the perimeter ground balls to connect to one of the ground connections not vertically aligned with the at least one of the ground vias.

12. The CPU of claim 8, wherein the electrically conductive epoxy mold comprises epoxy resin with conductive particles.

13. The CPU of claim 12, wherein the electrically conductive epoxy mold has a conductivity of at least 105 Siemens/meter.

14. The CPU of claim 8, wherein lambda comprises a frequency of 6 GHz.

15. The CPU of claim 8, wherein the SOC substrate comprises:
  connectors to connect to a nonvolatile memory device;
  connectors to connect to a display device;
  connectors to connect to a network interface; or
  connectors to connect to a battery to power the CPU.

* * * * *

UNITED STATES PATENT AND TRADEMARK OFFICE
CERTIFICATE OF CORRECTION

PATENT NO. : 12,381,160 B2
APPLICATION NO. : 16/824544
DATED : August 5, 2025
INVENTOR(S) : Jaejin Lee et al.

Page 1 of 1

It is certified that error appears in the above-identified patent and that said Letters Patent is hereby corrected as shown below:

In the Claims

Column 28, Line 46 reads:
"The memory device of claim 5, wherein the electrically conductive epoxy mold has a conductivity of a least 105 Siemens/meter."

Should read:
The memory device of claim 5, wherein the electrically conductive epoxy mold has a conductivity of at least $10^5$ Siemens/meter.

Column 30, Line 9 reads:
"The CPU of claim 12, wherein the electrically conductive epoxy mold has a conductivity of at least 105 Siemens/meter."

Should read:
The CPU of claim 12, wherein the electrically conductive epoxy mold has a conductivity of at least $10^5$ Siemens/meter.

Signed and Sealed this
Second Day of September, 2025

Coke Morgan Stewart
*Acting Director of the United States Patent and Trademark Office*